United States Patent [19]
Patel et al.

[11] Patent Number: 5,525,983
[45] Date of Patent: Jun. 11, 1996

[54] METHOD AND APPARATUS FOR IMPLEMENTING A TYPE 8B6T ENCODER AND DECODER

[75] Inventors: Sandeep Patel, Cupertino, Calif.; Howard W. Johnson, Woodinville, Wash.; J. R. Rivers, Santa Clara, Calif.

[73] Assignee: 3Com Corporation, Santa Clara, Calif.

[21] Appl. No.: 248,934

[22] Filed: May 25, 1994

[51] Int. Cl.$^6$ ................................................. H03M 5/16
[52] U.S. Cl. .......................................... 341/57; 341/58
[58] Field of Search ................................ 341/57, 58, 59, 341/106

[56] References Cited

U.S. PATENT DOCUMENTS

| | | | |
|---|---|---|---|
| 3,611,141 | 10/1971 | Waters | 341/57 |
| 3,713,123 | 1/1973 | Lipp | 341/57 |
| 3,902,117 | 8/1975 | Sheppard | 341/57 |
| 4,087,642 | 5/1978 | Jessop et al. | 179/15 BM |
| 4,092,595 | 5/1978 | Weir et al. | 341/57 |
| 4,244,052 | 1/1981 | Hemsworth | 371/56 |
| 4,307,468 | 12/1981 | Beasley et al. | 455/608 |
| 4,387,366 | 6/1983 | Chow | 341/57 |
| 4,486,740 | 12/1984 | Seidel | 341/57 |
| 4,631,428 | 12/1986 | Grimes | 307/475 |
| 4,661,801 | 4/1987 | Chen et al. | 341/57 |
| 4,779,073 | 10/1988 | Iketani | 341/55 |
| 4,910,750 | 3/1990 | Fisher | 375/19 |

Primary Examiner—Marc S. Hoff
Attorney, Agent, or Firm—Townsend and Townsend and Crew; Kenneth R. Allen; Stephen J. LeBlanc

[57] ABSTRACT

An apparatus and method for transmitting an 8-bit binary format data word as a 6-trit ternary code word includes an encoder, a decoder, and a code assignment that produce, for each 8-bit data word value, an unique 6-trit ternary code word that is particularly optimized for transmission over twisted-pair cable. The logic circuitry of the invention is optimized to accomplish the translation using a small number of combinatorial logic gates. The present invention thus has advantages in size, speed and performance over other possible means for encoding an 8 bit data word to a 6 trit code word.

16 Claims, 10 Drawing Sheets

| 8 Bit | 12 Bit | 6T | 8 Bit | 12 Bit | 6T |
|---|---|---|---|---|---|
| 00000000 | 001101010011 | -+00-+ | 00110010 | 101100010011 | 0+-0-+ |
| 00000001 | 010011001101 | 0-+-+0 | 00110011 | 101100110100 | 0+-+0- |
| 00000010 | 010011010011 | 0-+0-+ | 00110100 | 110010110100 | +-0+0- |
| 00000011 | 010011110100 | 0-++0- | 00110101 | 001011001101 | -0+-+0 |
| 00000100 | 001101110100 | -+0+0- | 00110110 | 001011010011 | -0+0-+ |
| 00000101 | 110100001101 | +0--+0 | 00110111 | 001011110100 | -0++0- |
| 00000110 | 110100010011 | +0-0-+ | 00111000 | 110010101100 | +-00+- |
| 00000111 | 110100110100 | +0-+0- | 00111001 | 101100110010 | 0+-+-0 |
| 00001000 | 001101101100 | -+00+- | 00111010 | 101100101100 | 0+-0+- |
| 00001001 | 010011110010 | 0-++-0 | 00111011 | 101100001011 | 0+--0+ |
| 00001010 | 010011101100 | 0-+0+- | 00111100 | 110010001011 | +-0-0+ |
| 00001011 | 010011001011 | 0-+-0+ | 00111101 | 001011110010 | -0++-0 |
| 00001100 | 001101001011 | -+0-0+ | 00111110 | 001011101100 | -0+0+- |
| 00001101 | 110100110010 | +0-+-0 | 00111111 | 001011001011 | -0+-0+ |
| 00001110 | 110100101100 | +0-0+- | 01000000 | 000101111011 | -00+0+ |
| 00001111 | 110100001011 | +0--0+ | 01000001 | 010001101111 | 0-00++ |
| 00010000 | 010000111011 | 0--+0+ | 01000010 | 010001111011 | 0-0+0+ |
| 00010001 | 000100101111 | -0-0++ | 01000011 | 010001111110 | 0-0++0 |
| 00010010 | 000100111011 | -0-+0+ | 01000100 | 000101111110 | -00++0 |
| 00010011 | 000100111110 | -0-++0 | 01000101 | 010100101111 | 00-0++ |
| 00010100 | 010000111110 | 0--++0 | 01000110 | 010100111011 | 00-+0+ |
| 00010101 | 000001101111 | --00++ | 01000111 | 010100111110 | 00-++0 |
| 00010110 | 000001111011 | --0+0+ | 01001000 | 101011101010 | 00+000 |
| 00010111 | 000001111110 | --0++0 | 01001001 | 111100101010 | ++-000 |
| 00011000 | 001101001101 | -+0-+0 | 01001010 | 110011101010 | +-+000 |
| 00011001 | 110010001101 | +-0-+0 | 01001011 | 001111101010 | -++000 |
| 00011010 | 001111001101 | -++-+0 | 01001100 | 101100101010 | 0+-000 |
| 00011011 | 111010001101 | +00-+0 | 01001101 | 110100101010 | +0-000 |
| 00011100 | 111010110010 | +00+-0 | 01001110 | 010011101010 | 0-+000 |
| 00011101 | 001111110010 | -+++-0 | 01001111 | 001011101010 | -0+000 |
| 00011110 | 110010110010 | +-0+-0 | 01010000 | 110000111011 | +--+0+ |
| 00011111 | 001101110010 | -+0+-0 | 01010001 | 001100101111 | -+-0++ |
| 00100000 | 001111000101 | -++-00 | 01010010 | 001100111011 | -+-+0+ |
| 00100001 | 111010110000 | +00+-- | 01010011 | 001100111110 | -+-++0 |
| 00100010 | 001101001111 | -+0-++ | 01010100 | 110000111110 | +--++0 |
| 00100011 | 110010001111 | +-0-++ | 01010101 | 000011101111 | --0++ |
| 00100100 | 110010111010 | +-0+00 | 01010110 | 000011111011 | --++0+ |
| 00100101 | 001101111010 | -+0+00 | 01010111 | 000011111110 | --+++0 |
| 00100110 | 111010000101 | +00-00 | 01011000 | 000001111111 | --0+++ |
| 00100111 | 001111110000 | -+++-- | 01011001 | 000100111111 | -0-+++ |
| 00101000 | 101111000100 | 0++-0- | 01011010 | 010000111111 | 0--+++ |
| 00101001 | 111011010000 | +0+0-- | 01011011 | 010000101111 | 0--0++ |
| 00101010 | 111011000100 | +0+-0- | 01011100 | 110000101111 | +--0++ |
| 00101011 | 111011000001 | +0+--0 | 01011101 | 000101101111 | -000++ |
| 00101100 | 101111000001 | 0++--0 | 01011110 | 101111110000 | 0+++-- |
| 00101101 | 111110010000 | ++00-- | 01011111 | 101111000101 | 0+-00 |
| 00101110 | 111110000100 | ++0-0- | 01100000 | 101111010001 | 0++0-0 |
| 00101111 | 111110000001 | ++0--0 | 01100001 | 111011000101 | +0+-00 |
| 00110000 | 110010010011 | +-00-+ | 01100010 | 111011010001 | +0+0-0 |
| 00110001 | 101100001101 | 0+---+0 | 01100011 | 111011010100 | +0+00- |

*FIG. 3a*

| 8 Bit | 12 Bit | 6T | 8 Bit | 12 Bit | 6T |
|---|---|---|---|---|---|
| 01100100 | 101111010100 | 0++00- | 10010110 | 000011110011 | --++-+ |
| 01100101 | 111110000101 | ++0-00 | 10010111 | 000011111100 | --+++- |
| 01100110 | 111110010001 | ++00-0 | 10011000 | 110000101110 | +--0+0 |
| 01100111 | 111110010100 | ++000- | 10011001 | 001100111010 | -+-+00 |
| 01101000 | 101111001100 | 0++-+- | 10011010 | 001100101110 | -+-0+0 |
| 01101001 | 111011110000 | +0++-- | 10011011 | 001100101011 | -+-00+ |
| 01101010 | 111011001100 | +0-+-  | 10011100 | 110000101011 | +--00+ |
| 01101011 | 111011000011 | +0---+ | 10011101 | 000011111010 | --++00 |
| 01101100 | 101111000011 | 0++--+ | 10011110 | 000011101110 | --+0+0 |
| 01101101 | 111110110000 | ++0+-- | 10011111 | 000011101011 | --+00+ |
| 01101110 | 111110001100 | ++0-+- | 10100000 | 001111010001 | -++0-0 |
| 01101111 | 111110000011 | ++0--+ | 10100001 | 110011000101 | +-+-00 |
| 01110000 | 101010111100 | 000++- | 10100010 | 110011010001 | +-+0-0 |
| 01110001 | 101010110011 | 000+-+ | 10100011 | 110011010100 | +-+00- |
| 01110010 | 101010001111 | 000-++ | 10100100 | 001111010100 | -++00- |
| 01110011 | 101010111010 | 000+00 | 10100101 | 111100000101 | ++--00 |
| 01110100 | 101010110100 | 000+0- | 10100110 | 111100010001 | ++-0-0 |
| 01110101 | 101010110010 | 000+-0 | 10100111 | 111100010100 | ++-00- |
| 01110110 | 101010001011 | 000-0+ | 10101000 | 001111001100 | -++-+- |
| 01110111 | 101010001101 | 000-+0 | 10101001 | 110011110000 | +-++-- |
| 01111000 | 111111000001 | +++--0 | 10101010 | 110011001100 | +-+-+- |
| 01111001 | 111111000100 | +++-0- | 10101011 | 110011000011 | +-+--+ |
| 01111010 | 111111010000 | +++0-- | 10101100 | 001111000011 | -++--+ |
| 01111011 | 101111010000 | 0++0-- | 10101101 | 111100110000 | ++-+-- |
| 01111100 | 000101001111 | -00-++ | 10101110 | 111100001100 | ++--+- |
| 01111101 | 000101111010 | -00+00 | 10101111 | 111100000011 | ++---+ |
| 01111110 | 110000001111 | +---++ | 10110000 | 111010010001 | +000-0 |
| 01111111 | 110000111010 | +--+00 | 10110001 | 101110000101 | 0+0-00 |
| 10000000 | 000101110011 | -00+-+ | 10110010 | 101110010001 | 0+00-0 |
| 10000001 | 010001001111 | 0-0-++ | 10110011 | 101110010100 | 0+000- |
| 10000010 | 010001110011 | 0-0+-+ | 10110100 | 111010010100 | +0000- |
| 10000011 | 010001111100 | 0-0++- | 10110101 | 101011000101 | 00+-00 |
| 10000100 | 000101111100 | -00++- | 10110110 | 101011010001 | 00+0-0 |
| 10000101 | 010100001111 | 00--++ | 10110111 | 101011010100 | 00+00- |
| 10000110 | 010100110011 | 00-+-+ | 10111000 | 111010001100 | +00-+- |
| 10000111 | 010100111100 | 00-++- | 10111001 | 101110110000 | 0+0+-- |
| 10001000 | 000101101110 | -000+0 | 10111010 | 101110001100 | 0+0-+- |
| 10001001 | 010001111010 | 0-0+00 | 10111011 | 101110000011 | 0+0--+ |
| 10001010 | 010001101110 | 0-00+0 | 10111100 | 111010000011 | +00--+ |
| 10001011 | 010001101011 | 0-000+ | 10111101 | 101011110000 | 00++-- |
| 10001100 | 000101101011 | -0000+ | 10111110 | 101011001100 | 00+-+- |
| 10001101 | 010100111010 | 00-+00 | 10111111 | 101011000011 | 00+--+ |
| 10001110 | 010100101110 | 00-0+0 | 11000000 | 001101110011 | -+0+-+ |
| 10001111 | 010100101011 | 00-00+ | 11000001 | 010011001111 | 0-+-++ |
| 10010000 | 110000110011 | +--+-+ | 11000010 | 010011110011 | 0-++-+ |
| 10010001 | 001100001111 | -+---++ | 11000011 | 010011111100 | 0-+++- |
| 10010010 | 001100110011 | -+-+-+ | 11000100 | 001101111100 | -+0++- |
| 10010011 | 001100111100 | -+-++- | 11000101 | 110100001111 | +0--++ |
| 10010100 | 110000111100 | +--++- | 11000110 | 110100110011 | +0-+-+ |
| 10010101 | 000011001111 | --+-++ | 11000111 | 110100111100 | +0-++- |

*FIG.3b*

| 8 Bit | 12 Bit | 6T | 8 Bit | 12 Bit | 6T |
|---|---|---|---|---|---|
| 11001000 | 001101101110 | -+00+0 | 11100100 | 001111110100 | -+++0- |
| 11001001 | 010011111010 | 0-++00 | 11100101 | 111100001101 | ++--+0 |
| 11001010 | 010011101110 | 0-+0+0 | 11100110 | 111100010011 | ++-0-+ |
| 11001011 | 010011101011 | 0-+00+ | 11100111 | 111100110100 | ++-+0- |
| 11001100 | 001101101011 | -+000+ | 11101000 | 001111101100 | -++0+- |
| 11001101 | 110100111010 | +0-+00 | 11101001 | 110011110010 | +-++-0 |
| 11001110 | 110100101110 | +0-0+0 | 11101010 | 110011101100 | +-+0+- |
| 11001111 | 110100101011 | +0-00+ | 11101011 | 110011001011 | +-+-0+ |
| 11010000 | 110010110011 | +-0+-+ | 11101100 | 001111001011 | -++-0+ |
| 11010001 | 101100001111 | 0+--++ | 11101101 | 111100110010 | ++-+-0 |
| 11010010 | 101100110011 | 0+-+-+ | 11101110 | 111100101100 | ++-0+- |
| 11010011 | 101100111100 | 0+-++- | 11101111 | 111100001011 | ++--0+ |
| 11010100 | 110010111100 | +-0++- | 11110000 | 111010010011 | +000-+ |
| 11010101 | 001011001111 | -0+-++ | 11110001 | 101110001101 | 0+0-+0 |
| 11010110 | 001011110011 | -0++-+ | 11110010 | 101110010011 | 0+00-+ |
| 11010111 | 001011111100 | -0+++- | 11110011 | 101110110100 | 0+0+0- |
| 11011000 | 110010101110 | +-00+0 | 11110100 | 111010110100 | +00+0- |
| 11011001 | 101100111010 | 0+-+00 | 11110101 | 101011001101 | 00+-+0 |
| 11011010 | 101100101110 | 0+-0+0 | 11110110 | 101011010011 | 00+0-+ |
| 11011011 | 101100101011 | 0+-00+ | 11110111 | 101011110100 | 00+0+- |
| 11011100 | 110010101011 | +-000+ | 11111000 | 111010101100 | +000+- |
| 11011101 | 001011111010 | -0++00 | 11111001 | 101110110010 | 0+0+-0 |
| 11011110 | 001011101110 | -0+0+0 | 11111010 | 101110101100 | 0+00+- |
| 11011111 | 001011101011 | -0+00+ | 11111011 | 101110001011 | 0+0-0+ |
| 11100000 | 001111010011 | -++0-+ | 11111100 | 111010001011 | +00-0+ |
| 11100001 | 110011001101 | +-+-+0 | 11111101 | 101011110010 | 00++-0 |
| 11100010 | 110011010011 | +-+0-+ | 11111110 | 101011101100 | 00+0+- |
| 11100011 | 110011110100 | +-++0- | 11111111 | 101011001011 | 00+-0+ |

*FIG.3c*

```
m1 = B7 * B5 * !B4;
m2 = !B7 * !B6 * B5 * B4;
m3 = !B7 * !B6 * !B5 * !B4;
m4 = !B7 * B6 * !B5 * B4 * !B3;
m5 = B7 * !B6 * !B5 * B4;
m6 = B7 * B6 * !B5 * !B4;
m7 = B7 * B6 * !B5 *B4;
p1 = B2 * (B1 + B0);
p2 = !B2 * (B1 + B0);
p3 = !B1 * !B0;
s1 = !B7 * !B6 * !B5 * !B4 * !B3;
s2 = !B7 * !B6 * !B5 * !B4 * B3;
s3 = B7 * !B6 * !B5 * !B3;
s4 = B7 * B6 * !B5 * !B3;
s5 = !B7 * !B6 * B5 * B4 * !B3;
s6 = !B7 * !B6 * B5 * B4 * B3;
s7 = !B7 * B6 * B5 * !B4 * B3;
s8 = B7 * !B6 * B5 * B3;
s9 = B7 * B6 * B5 * !B3;
s10= B7 * B6 * B5 * B3;
t1 = (B1 * B0) + (B2 * !B1 * !B0);
t2 = !B1 * B0;
t3 = (!B2 * !B1 * !B0) + (B1 * !B0);
u1 = B1 + B0;
u2 = B2 + (!B1 * !B0);
v1 = B1 + !B0;
v2 = B0 + (B2 * !B1);
special = (!B7 * !B6 * !B5 * B4 * B3) + (!B7 *
    !B6 * B5 * !B4 * !B3) + (!B7 * B6 * !B5 *
    B3) + (!B7 * B6 * B5 * B4);

T10 = (((u1 * !B4) + (!u1 * B4)) * !special) +
    (!B7 * !B6 * !B5 * B4 * B3 * ((!B2 * B0) +
    (B2 * !B0))) + (!B7 * !B6 * B5 * !B4 * !B3
    * ((!B2 * B0) + (B2 * !B0))) + (!B7 * B6 *
    !B5 * !B4 * B3 * ((!B1 * B0) + (B1 * !B0)))
    + (!B7 * B6 * !B5 * B4 * B3 * ((!B2 * B1)
    + (B2 * !B1 * !B0))) + (!B7 * B6 * B5 * B4
    * B3 * ((!B2 * !B1) + (B1 * !B0) + (B2 *
    B1)));

T8 = (((u2 * !B4) + (!u2 * B4)) * !special) +
    (!B7 * !B6 * !B5 * B4 * B3 * ((!B2 * !B0) +
    (B2 * B0))) + (!B7 * !B6 * B5 * !B4 * !B3 *
    ((!B2 * !B0) + (B2 * B0))) + (!B7 * B6 *
    !B5 * !B4 * B3 * ((!B2 * B0) + (B2 * !B1)))
    + (!B7 * B6 * !B5 * B4 * B3 * ((!B1 * B0)
    + (B2 * B1))) + (!B7 * B6 * B5 * B4 * B3
    * !(B2 * B1));

T6 = ((((!B4 * (!B10 + !B8)) + (B4 * !B10 *
    !B8)) * !special) + (!B7 * !B6 * !B5 * B4 *
    B3 * ((!B2 * !B0) + (B2 * B0))) + (!B7 *
    !B6 * B5 * !B4 * !B3 * ((!B2 * !B0) + (B2 *
    B0))) + (!B7 * B6 * !B5 * !B4 * B3 * (B1
    + (!B2 * B0))) + (!B7 * B6 * !B5 * B4 *
    B3 * ((!B2 * B0) + (B2 * B1) + (!B2 * !B1
    * !B0))) + (!B7 * B6 * B5 * B4 * B3 * !(B2
    * B1));

T4 = (((v1 * !B3) + (!v1 * B3)) * !special) +
    (!B7 * !B6 * !B5 * B4 * B3 * B2) + (!B7 *
    !B6 * B5 * !B4 * !B3 * ((B2 * !B1) + (B2
    * B0) + (!B1 * B0))) + (!B7 * B6 * !B5 *
    B4 * B3 * ((!B2 * !B1) + (B1 * !B0))) +
    (!B7 * B6 * B5 * B4 * !B3 * (B1 + (!B2 *
    B0))) + (!B7 * B6 * B5 * B4 * B3 * ((B2 *
    B0) + (!B2 * B1)));

T2 = (((v2 * !B3) + (!v2 * B3)) * !special) +
    (!B7 * !B6 * !B5 * B4 * B3 * !B2) + (!B7 *
    !B6 * B5 * !B4 * !B3 * !((B2 * !B1) + (B2 *
    B0) + (B1 * B0))) + (!B7 * B6 * !B5 * B4
    * B3 * !(B2 * B1 * !B0)) + (!B7 * B6 * B5
    * B4 * !B3 * ((!B2 * !B0) + (B2 * B1 * B0)
    + (!B1 * !B0))) + (!B7 * B6 * B5 * B4 *
    B3 * ((B2 * !B0) + (!B2 * !B1 * B0)))

T0 = ((((!B3 * (!B2 + !B4)) + (B3 * !B4 * !B2))
    * !special) + (!B7 * !B6 * !B5 * B4 * B3 *
    !B2) + (!B7 * !B6 * B5 * !B4 * !B3 * !(B2
    * !B1) + (B2 * B0) + (!B1 * B0))) + (!B7
    * B6 * !B5 * B4 * B3 * !(B2 * B1 * !B0))
    + (!B7 * B6 * B5 * B4 * !B3 * ((B2 * B1)
    + (!B2 * !B1 * B0) + (B1 * !B0))) + (!B7 *
    B6 * B5 * B4 * B3 * ((B2 * !B0) + (!B1 *
    !B0)));

*FIG. 4b* al = T11 * T9 * T7;
ar = T5 * T3 * T1;
bl = !T11 * !T9 * !T7;
br = !T5 * !T3 * !T1;
cl = (T10 * !T8 * !T6) + (!T10 * T8 * !T6) + (!T10 * !T8 * T6);
cr = (T4 * !T2 * !T0) + (!T4 * T2 * !T0) + (!T4 * !T2 * T0);
dl = (!T10 * T8 * T6) + (T10 * !T8 * T6) + (T10 * T8 * !T6);
dr = (!T4 * T2 * T0) + (T4 * !T2 * T0) + (T4 * T2 * !T0);
el = (!T11 * T9 * T8 * T7) + (T11 * !T9 * T7 * T6) + (T11 * T10 * T9 * !T7);
er = (!T5 * T3 * T2 * T1) + (T5 * !T3 * T1 * T0) + (T5 * T4 * T3 * !T1);
fl = ( T11 * !T9 * !T8 * !T7) + (!T11 * T9 * !T7 * !T6) + (!T11 * !T10 * !T9 * T7);
fr = ( T5 * !T3 * !T2 * !T1) + (!T5 * T3 * !T1 * !T0) + (!T5 * !T4 * !T3 * T1);
lp0 = (T11 * T10 * !T9 * !T8 * T7 * !T6) + (T11 * !T10 * T9 * T8 * !T7 * !T6) + (!T11 * !T10 * T9 * !T8 * T7 * T6);
rp0 = (T5 * T4 * !T3 * !T2 * T1 * !T0) + (T5 * !T4 * T3 * T2 * !T1 * !T0) + (!T5 * !T4 * T3 * !T2 * T1 * T0);
ln0 = (!T11 * !T10 * T9 * T8 * !T7 * T6) + (!T11 * T10 * !T9 * !T8 * T7 * T6) + (T11 * T10 * !T9 * T8 * !T7 * !T6);
rn0 = (!T5 * !T4 * T3 * T2 * !T1 * T0) + (!T5 * T4 * !T3 * !T2 * T1 * T0) + (T5 * T4 * !T3 * T2 * !T1 * !T0);
lp1 = (al * cl) + el; rp1 = (ar * cr) + er;
ln1 = (bl * dl) + fl; rn1 = (br * dr) + fr;
lp2 = al * dl;
rp2 = ar * dr;
ln2 = bl * cl;
rn2 = br * cr;
lp3 = T10 * T8 * T6; rp3 = T4 * T2 * T0;
l0hat = !T10 * !T8 * !T6; r0hat = !T4 * !T2 * !T0;
x10 = (T10 * !cl) + (!T10 * cl);
x8 = (T8 * !cl) + (!T8 * cl);
x4 = (T4 * !cr) + (!T4 * cr);
x2 = (T2 * !cr) + (!T2 * cr);

special = (l0hat + r0hat + lp3 + rp3 + ( !T10 * T8 * T6 * !T4 * T2 * T0) + ( !T10 * T8 * T6 * T4 * !T2 * !T0) + ( T10 * !T8 * !T6 * !T4 * T2 * T0) + ( T10 * !T8 * !T6 * T4 * !T2 * !T0));

B7 = ((lp1 + rp1) * !(l0hat + r0hat)) * !special;

B6 = (((lp0 + ln0 + l0hat) * rp1) + (ln1 * rp2) + (ln2 * rp3) + ((rp0 + rn0 + r0hat) * lp1) + (rn1 * lp2) + (rn2 * lp3)) * !special + special * !(((rp0 + rn0) * !l0hat) + (lp1 * rn1) + ((ln0 + lp0) * rp1));

B5 = ((lp0 * !rp1) + lp1 + lp2 + lp3) * !special + special * (((T9 + T7) * rp1) + (lp1 * rn1) + l0hat + (lp2 * rn2) + (ln1 * !rp2) + lp3);

B4 = (cl * !special) + special * !( ((ln0 + lp0) * rp1) + (lp1 *rn1) + r0hat);

B3 = (cr * !special) + special * !( ((ln0 + lp0) * rp1) + (lp1 *rn1) + l0hat);

B2 = (((x10 * x8) + (!x10 * x2)) * !special) + special * (rp0 + (l0hat * rn0)+ ((lp0 + ln0) * rp1 * T5) + (lp0 * r0hat) + (ln0 * r0hat) + (lp2 * !(!T5 * T4)) + (rp2 * !(!T11 * T10)) + (ln1 * rp1) + (lp1 * rn1 * ((T6 * T5) + (!T6 * !T5))));

B1 = (((x10 * x4) + (!x10 * !x4)) * !special) + special * ((lp1 * rn0) + (rp0 * !(T9 * T7)) + (rp1 * ((!T6 * !T4) + (!T7 * !T6 * T5) + (!T11 * T9 * !T5))) + (rn1 * ((T6 * T5) + (!T6 * !T5) + (T11 * !T10))) + (r0hat * (T6 * !(T11 * T9))) + (ln2 * !T8 * !T6) + (rn2 * !T2 * !T0) + (l0hat * ((T3 * T1) + (!T5 * !T1))));

B0 = (((x10 * x2) + (!x10 * !x4)) * !special) + special * ((rn0 * T11 * !T5) + (rp0 * (!T11)) + (T5 * T4 * !T3 * !T2 * !T1 * !T0 * !(T11 * !T10)) + (rp1 * ((!T0 * !T7) + (T7 * !T5 * !T9))) + (r0hat * ((T11 * T10 * T8) + (!T11 * !T10 * T7))) + (ln2 * (!T4 + T8)) + (rp2 * T6) + (lp2 * !T4) + (l0hat * (!T2 * T4)) + (rn2 * (T2 + !T10)));

*FIG. 7*

METHOD AND APPARATUS FOR IMPLEMENTING A TYPE 8B6T ENCODER AND DECODER

BACKGROUND OF THE INVENTION

The invention relates generally to electric signal and data processing and more particularly to a new and improved means for encoding a binary data word as a ternary code word and for decoding the ternary code word to recapture the binary data word for data transmission in a high speed network. The invention includes circuits for encoding and decoding the ternary code word and for maintaining DC balance in a series of transmitted ternary code words.

Binary (two-level) to ternary (three-level) data conversion has long been recognized as being beneficial for placement of data on an electromagnetic channel. Such a channel may be a storage medium such as a disk dive or magnetic tape or may be a transmission medium, such as an electric transmission line (twisted-pair). The three voltage levels (positive, negative, and zero, sometimes represented as the digits +, −, and 0) of ternary signals can provide a number of advantages over binary signals in data transmission and storage. One advantage is that ternary coding inherently carries more data per bit than binary data. For example, six binary bits can represent only 2⁶ or 64 different values, whereas six ternary bits (or trits) can represent $3^6$ or 729 different values. This increased data carrying capacity can be effectively used to increase the speed of data transmission and the density of data storage.

The three levels of ternary data can also provide a way for eliminating the problem of an accumulated DC signal that can arise in binary data signals. A DC signal may arise in the transmission of a binary signal because the voltage on the signal line varies between a positive voltage level (such as +5) and 0 volts. During transmission of such a signal, the signal line will take on a overall positive charge, and this can increase sensitivity to signal distortion by noise or cross-talk interference. Ternary signals can eliminate this problem so long as the transmitted + and − voltage signals are in balance with each other. In order to effectively maintain DC balance, prior art ternary encoders include sometimes complex adder circuitry to keep a running total of the charge of transmitted ternary digits and have included an inverter circuit to invert selected transmitted ternary words when the accumulated DC voltage level diverges from zero. Some of these prior art encoders include additional information in the transmitted data to indicate when a word has been inverted.

Ternary signals can also be designed to incorporate a guaranteed number of voltage transitions on the media during a specified period of time. These guaranteed voltage transitions can be used to maintain data self-clocking and error checking. Some prior art ternary encoder circuits include a "repeat code" or other means to ensure periodic voltage transitions by preventing transmission of long strings of identical digits.

A number of binary-to-ternary encoders and decoders have been developed incorporating the above discussed principles, but thus far these circuits have been limited in the size of the binary word that is converted to a ternary code. Various methods and apparatus have been disclosed for translation of 2 binary bits to 1 ternary trit (2B1T), 3 binary bits to 2 ternary trits (3B2T), and 6 binary bits to 4 ternary trit (6B4T). Each of these translation methods claims specific advantages based on the translation used and each is designed for a particular application.

For example, U.S. Pat. No. 4,910,750, to Fisher, discloses a 3B2T code with a method for ensuring that no 2T code word is ever repeated during serial transmission. A claimed advantage of this invention is the facilitation of self-clocking by ensuring that a voltage transition occurs at least once during any two transmitted ternary words. The encoder uses a look-up table to accomplish the binary to ternary translation and a comparer with a memory to compare each to-be-transmitted word with the previously transmitted word and to substitute a "repeat" code whenever two words in sequence are identical. The use of the look-up table makes this invention impractical when applied to high speed network applications because the access time for look up table memories is too slow.

U.S. Pat. No. 4,779,073, to Iketani, discloses a 3B2T encoder with a look-up table similar to Fisher but including, in a second embodiment, an accumulator circuit and an inverter. The accumulator circuit determines the running "algebraic weight" of the transmitted ternary signals. The algebraic weight is defined as the sum of the ternary digits in the code word, where the two trit ternary code word "+0" would have an algebraic weight of plus one (+1) and the ternary code word "−−" would have an algebraic weight of minus two (−2). The inverter is used to change the polarity of selected ternary words when the accumulated algebraic weight of transmitted words deviates from zero. The Iketani system uses a comparer to ensure that no 2T code word is ever repeated during serial transmission by replacing an even numbered pair of ternary symbols whenever two ternary code words in series are identical. DC balance is maintained through use of an inverter which inserts a "synchronous pattern" into the ternary data stream to let the decoder know when a code word has been inverted. One problem with the addition of the "synchronous pattern" into the ternary signal is that it reduces the overall speed of transmitted data and adds a data-dependent delay and circuit complexity to the Iketani system.

U.S. Pat. No. 4,387,366 to Chow discloses a 4B3T code converter with a PROM look-up table that stores inversion ternary code words along with non-inverted code words to maintain DC balance. A counter circuit adds up the algebraic weight of transmitted code words and selects the inverted ternary codes from the PROM to maintain DC balance when the balance deviates from zero. A claimed advantage of this invention is the facilitation of self-clocking by ensuring that a voltage transition occurs at least once during any two transmitted ternary words. As in Iketani, the look-up table and DC balance means are particularly unsuited for use in a high-speed network due to the slow access time of available memories that can serve as look-up tables.

Another encoder that uses a look-up table for binary to ternary translation is U.S. Pat. No. 4,092,595, to Weir, which discloses a 3B3T encoder.

U.S. Pat. No. 3,611,141, to Waters, discloses a 4B3T data transmission terminal that includes a disparity (or algebraic weight) checker and an inverter to maintain a zero DC balance. The binary to ternary translation uses combinatorial logic to translate from binary to ternary and provides a means to ensure that the maximum accumulated algebraic weight is four and that the longest possible string of identical ternary digits in a transmitted data stream is six. According to the system, no attempt is made in the translation to find a translation that uses a small number of logic gates. For this reason and because of the complexity of the disparity checking and inversion circuitry, the Waters system would be ineffective when applied to larger binary to ternary code conversions.

U.S. Pat. No. 4,244,052, to Hemsworth, provides a means for detecting misalignment of received words for a 6B4T translation system built according to the Waters system. Other systems that reference the Waters method for binary to ternary translation are U.S. Pat. No. 4,087,642 to Jessop (4B3T), and U.S. Pat. No. 3,902,117 to Sheppard (4B3T).

U.S. Pat. No. 4,631,428 to Grimes discloses a system for communicating data between binary chips using a 3B2T code converter that employs combinatorial logic. This system is not concerned with DC balance or other transmission issues and does not include means for addressing those problems. The system first translates the 3B code word to a 6B ternary control word which is used to control the 2T ternary drivers.

One specific application for binary to ternary translation that is not effectively addressed by the prior art systems is in high speed data transmission between computers in a network. On Sep. 28, 1993, the Fast Ethernet Alliance, a non-sanctioned technical group of the IEEE, proposed a new standard (the 4T+ Media Specification) for data transmission over four twisted pairs using a modification of the ethernet network protocol and using an 8B6T binary to ternary translation. The proposal was made to the IEEE 802.3 High-Speed Study Group. The 4T+ Media Specification proposes to achieve transmission speeds of 100 megabits per second using available ethernet transmission technology. This represents a 10 fold increase in speed over standard ethernet transmissions. As discussed above, prior art binary to ternary encoders are not well suited to perform the binary to ternary code conversion needed in this system.

What is needed is an 8B6T encoder and decoder and 8B to 6T code assignment that can utilize fast combinatorial logic, that efficiently preserves DC balance, that ensures frequent voltage transitions in a transmitted serial data stream and that is suited for high-speed processing and transmission in a computer network.

SUMMARY OF THE INVENTION

According to the present invention, an apparatus and method for transmitting an 8-bit binary format data word as a 6-trit ternary code word includes an encoder that produces, for each 8-bit data word value, an unique 6-trit ternary code word that is particularly optimized for transmission over twisted-pair cable. The 8-bit data word is first translated by binary logic circuitry into a 12-bit binary coded ternary (BCT) code word, which is easily translated into the 6-trit code word. The logic circuitry of the invention is optimized to accomplish the translation using a small number of combinatorial logic gates (less than 2000). The present invention thus has advantages in size, speed and performance over other possible means for encoding an 8 bit data word to a 6 trit code word.

The present invention maps 256 binary-based 8 bit groups into 256 of a possible 729 six trit ternary groups by using combinatorial logic that selects only code words that meet specific criteria that make the code words well suited for transmission. A technique and apparatus is included for ensuring that the accumulated DC balance of the data stream remains at zero.

The available six trit code words are characterized in the present invention by two parameters. An algebraic weight (W) of each code word represents the sum of the digits in the six trit code word, with possible values ranging from −6 to +6. A parameter Z of each code word indicates the maximum number of leading or trailing zeros that are present in the code word. The present invention selects values for these parameters that result in very efficient translation from binary to ternary and result in the most effective data transmission.

According to the invention, these parameters are selected and allowable 6T code words are determined as follows. Of the 729 possible 6T code words, it will be found that 18 have four or more leading or trailing zeros. If these words are eliminated, of the remaining 711 possible 6T code words, it will be found that 134 have an algebraic weight of 0 and 122 have an algebraic weight (W) of +1, making a total of 256 possible 6T code words with an algebraic weight of either 0 or +1 and having fewer than 4 leading or trailing zeros. Selecting only code words with an algebraic weight of either 0 or +1 immediately reduces the problem of DC balance in the transmitted ternary signal and, as will be seen below, allows for an easy apparatus for ensuring that the D.C. balance is exactly zero. Selecting only code words that have fewer than four leading or trailing zeros eliminates the need for circuitry to prevent the transmission of duplicate ternary words as is present in a number of the prior art references discussed above. This circuitry is not needed because each allowed 6T code word guarantees at least 2 voltage transitions for each six trits of code word transmitted, even if the same code word is repeated indefinitely. The guaranteed voltage transitions provided by the invention allow the transmitted code words to be reliably self clocking. The elimination of the need for compare and substitution circuitry to prevent duplicate code words from being transmitted is one advantage of this invention over prior art binary to ternary converters.

In order to process the 6T code words in conventional binary logic circuits, the 6T code words are first represented within the encoder and decoder by a 12 bit, binary coded ternary (BCT) code word, where each trit of the 6T code word is encoded as two bits. This assignment and the assignment of 8B data words to 6T code words according to the invention is done so that the translation from an 8B data word to a 12B binary-coded-ternary (BCT) code word can be accomplished using a simple combinatorial logic scheme.

An encoder/transmitter built according to the invention includes a register to receive an 8-bit data word, a combinatorial logic block for translating from the 8-bit data word to a 12-bit BCT code word with an inversion control circuit for inverting every second 12-bit BCT code word that represents a 6-trit ternary word with an algebraic weight of +1 in order to preserve DC balance, a data splitter, a plurality of parallel-in/serial-out shift registers for shifting out the 12-bit code word 2-bits at a time, and a plurality of pulse shapers that produce ternary pulses in response to the 2-bit outputs of the shift registers.

In one specific embodiment of the invention, the pulse shapers produce a Nyquist pulse for pulse transmission.

A decoder/receiver built according to the invention includes a plurality of pulse detectors that each produce a 2-bit output in response to ternary pulses detected on a transmission line, a plurality of shift registers for assembling the 2-bit outputs into received 12-bit BCT code words, a combinatorial logic circuit for translating from the 12-bit BCT code word to an 8-bit data word with an invertor circuit for inverting every 12-bit BCT code word that has an algebraic weight of −1, and a register for receiving the 8-bit data words.

The invention will be understood more completely upon reference to the following detailed description in connection with the accompanying drawings.

BRIEF DESCRIPTION OF THE DRAWINGS

FIGS. 3a, 3b, and 3c together are a table showing the correspondence between 8-bit data words, 12-bit binary coded ternary code words, and 6-trit ternary code words according to a specific embodiment of the invention;

FIGS. 4a and 4b show the logic relationships between each digit of an input 8-bit data word and each digit of an output 12-bit binary coded ternary code word according to an embodiment of the invention;

FIG. 7 shows the logic relationships between each digit of an input 12-bit binary coded ternary code word and each digit of an output 8-bit data word according to an embodiment of the invention.

DETAILED DESCRIPTION OF SPECIFIC EMBODIMENTS

Figure 1:
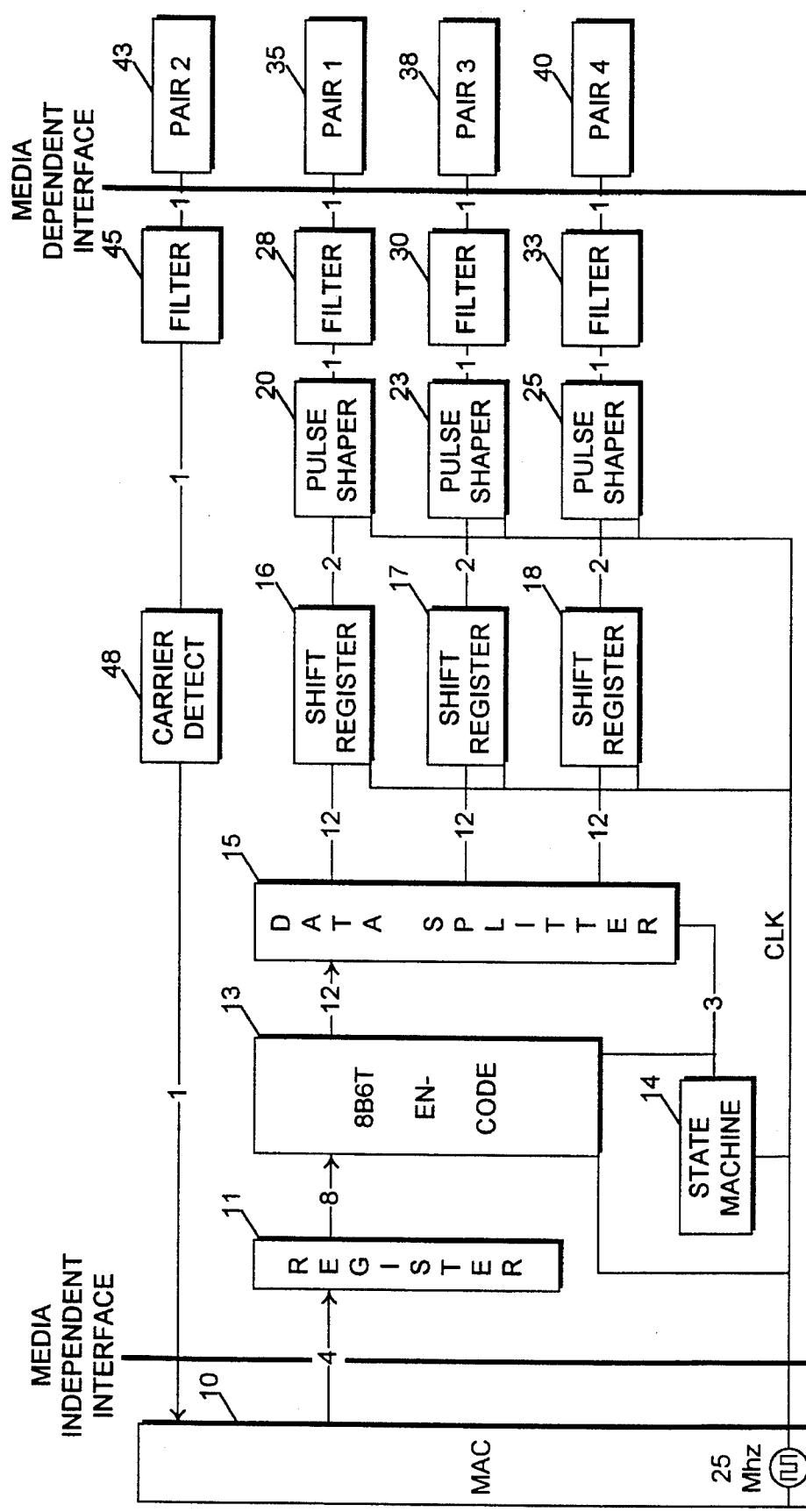
FIG. 1 is a block diagram of a data encoding and transmission system that could effectively employ an 8B6T encoder according to the invention.

FIG. 1 shows one type of data transmission system in which the encoder of the present invention may be effectively employed. This transmission system was discussed in the Fast Ethernet Alliance's 4T+ Media Specification proposal discussed above. The system is designed to transmit data over a total of four twisted-pair transmission lines. It contains a Media Access Controller (MAC) 10, which is connected to the system bus (not shown) of a computer or other data processing unit. MAC 10 receives data from the system bus. In the Fast Ethernet Alliance proposal, the MAC is specified to output that data as 4-bit nibbles at a clock rate of 25 Mhz, giving an effective bit rate of 100 Mbps.

The 4-bit nibbles from MAC 10 are received by an 8-bit register 11. Register 11 receives two nibbles and then makes the resulting 8-bit data word available to 8B6T encoder 13. The encoder encodes the 8-bit data word and outputs a 12-bit binary coded ternary (BCT) code word, which represents a 6-trit ternary code word, to data splitter 15. Operation of data splitter 15 is controlled by state machine 14 which is connected to the MAC's clock and which provides a simple sequential 3-bit select signal to data splitter 15 and encoder 13. The data splitter time de-multiplexes the 12-bit code words among three shift registers 16, 17, and 18 in a round robin fashion in response to the 3-bit select signal from state machine 14. These shift registers shift out 2-bits (representing one trit) of the code words every clock cycle to transmission pulse shapers 20, 23, and 25. The pulse shapers generate pulses in response to their inputs and these pulses are transmitted through filters 28, 30, and 33 onto twisted pairs 35, 38, and 40. The pulse shapers produce a ternary pulse for each two-bit input according to the code shown in Table 1.

TABLE 1

| Binary | Ternary |
| --- | --- |
| 00 | − |

TABLE 1-continued

| Binary | Ternary |
| --- | --- |
| 01 | 0 |
| 10 | 0 |
| 11 | + |

Collision detect and carrier detect in this system are accomplished over a fourth twisted pair 43. While the system is transmitting, twisted pair 43 is monitored through filter 45 by carrier sense detector circuit 48. If a carrier is detected by circuit 48 while the transmitter is transmitting, circuit 48 sends a signal to MAC 10 alerting it to a collision and MAC 10 halts data transmission and processes the error.

Figure 2:
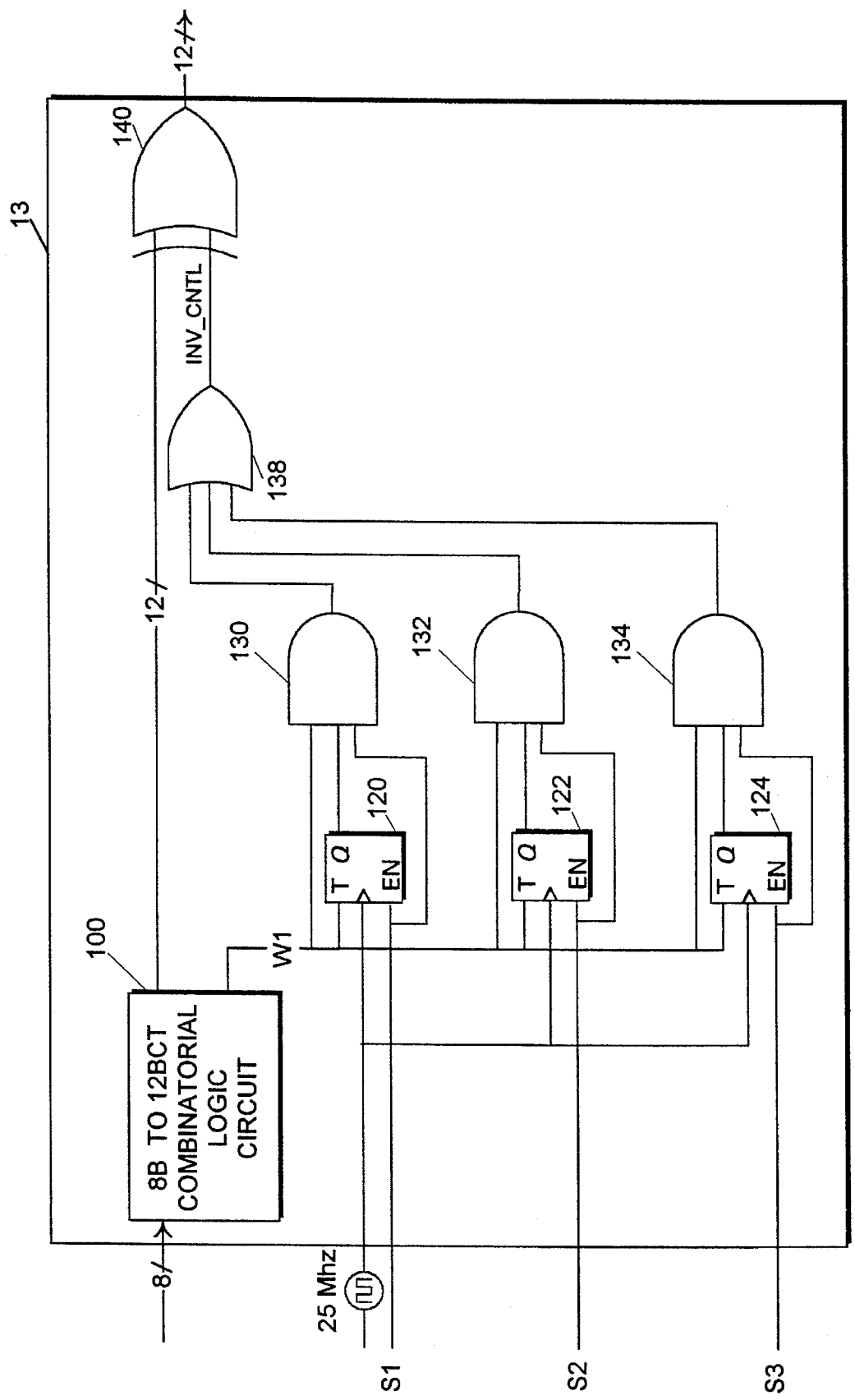
FIG. 2 is a block diagram of an 8B6T encoder according to an embodiment of the invention.

FIG. 2 shows encoder 13 in more detail. Once the eight bits of data are available from register 11, the data word is presented to combinatorial logic block 100. Logic block 100 converts the 8-bit data word into a 12-bit binary-coded-ternary (BCT) code word having the algebraic weight and zero properties discussed above. All utilized code words have a ternary algebraic weight of either 0 or +1 and all have fewer than 4 leading or trailing zeros. For any 8-bit data input shown in FIGS. 3a, 3b, and 3c, combinatorial logic block 100 produces the 12-bit BCT output as shown in those figures. Each 12-bit binary code word is representative of a 6-trit ternary code word also as shown in FIGS. 3a, 3b, and 3c. In one embodiment of the invention, combinatorial logic block 100 implements the logic equations shown in FIGS. 4a and 4b.

Combinatorial logic block 100 also generates the binary signal W1 in response to the ternary algebraic weight of the BCT code word. Signal W1 is high when the 12-bit BCT code word represents a ternary code word with an algebraic weight of one and low when the 12-bit BCT code word represents a ternary code word with an algebraic weight of zero. As discussed above, the algebraic weight of a ternary code word is determined by adding together all the digits in the code word. For example, the ternary code word "0−+−+0", which according to the invention is mapped from binary data word "00000001", has an algebraic weight of zero.

Block 100 may be constructed of discrete logic elements, may be a programmable logic array, or may be a custom integrated logic circuit. The logic equations as presented in FIGS. 4a and 4b and the code assignment shown in FIGS. 3a, 3b, and 3c have been selected to minimize the number of logic gates needed to construct block 100. According to the invention, combinatorial logic block 100 may be built with less than 2,000 logic gates.

The invention maintains a zero DC balance on each twisted pair for the transmitted ternary signal by inverting every second ternary code word on each twisted pair that has an algebraic weight of +1. This inversion produces an inverted ternary code word with an algebraic weight of −1. For example, the ternary code word "−+00+0" with an algebraic weight of +1, when inverted produces the code word "+−00−0" with an algebraic weight of −1. With inversion of every other ternary code word with an algebraic weight of +1, if the algebraic weights of a series of nine ternary code words decoded by logic block 100 for one twisted pair were +1,0,0,0,+1,+1,0,+1,0, an encoder according to the invention would invert the second and fourth code words with an algebraic weight of +1 to produce nine ternary code words with algebraic weights +1,0,0,0,−1,+1,0,−1,0 thus achieving an overall zero DC balance. It will be noted that with the 2-bit to 1-trit code assignment of Table 1, inversion of the 6-trit code word may be accomplish by simply inverting each bit in the 12-bit BCT code word.

Selective inversion on each of the three twisted pairs is accomplished as follows. The signal W1 generated by combinatorial logic block 100 is input to each of three selectable toggle register 120, 122, and 124 that essentially each act as 1-bit memories. The toggle registers operate such that their Q outputs will change from 0 to 1 or 1 to 0 (i.e. will "toggle") on an active clock edge whenever both their T inputs and their enable (EN) inputs are active. The enable inputs of the toggle registers are connected to one of the three outputs (S1-3) of state machine 14 such that during any given word cycle just one of the toggle registers is enabled.

The three toggle registers are each connected to one of the three input AND gates 130, 132, or 134. The AND gates combine the signal W1, the toggle register output, and the select line for each of the twisted pairs to generate a signal that is active during every other data word cycle where a data word with weight +1 for a given twisted pair is input into block 100.

OR gate 138 combines the outputs of the three AND gates to form the signal INV_CNTL which controls whether the code word output to the data splitter will be inverted. Once output by block 100, the 12-bit BCT code word is input to 12-bit XOR gate 140. XOR gate 140 performs an XOR function on each bit of the 12-bit code word with the one-bit signal INV_CNTL. As described above, the signal INV_CNTL is generated for each of the three twisted-pair lines based on the select signals generated by state machine 14. When signal INV_CNTL is high, XOR gate 140 operates so that its 12-bit output is the bit-by-bit inverse of its 12-bit input. When signal INV_CNTL is low, the 12-bit output of XOR gate 140 is the same as its input. After performing the selective inversion, XOR gate 140 outputs the 12-bit BCT code word to data splitter 15.

While a specific configuration for the 1-bit memory function of the toggle registers is shown, it would be obvious to one skilled in the art that there are many other logic circuit configurations that could perform the same function.

FIGS. 3a, 3b, and 3c show the particular assignment of the 256 possible 8-bit binary data words to 256 6-trit ternary code words according to the invention. The code assignment according to the invention can best be understood as follows. As discussed above, the 729 available six trit code words are characterized in the present invention by two parameters. An algebraic weight (W) of each code word represents the sum of the digits in the six trit code word, with possible values ranging from −6 to +6. A parameter Z of each code word indicates the maximum number of leading or trailing zeros that are present in the code word. According to the present invention, ternary code words are selected so that the parameter W=0 or +1 and Z=3.

Once the 256 allowable ternary code words have been selected, they must be assigned in a unique one to one relationship to the 256 possible 8-bit binary data words. This assignment is shown in FIGS. 3a, 3b, and 3c. The code assignment shown in FIGS. 3a–c was constructed so that a translation between an 8-bit data word and a 12-bit BCT code can be accomplished by a combinatorial logic block such as 100 using the least number of logic gates.

FIGS. 4a and 4b show a symbolic representation of the logic relationships that determine the outputs of combinatorial logic block 100 based on the inputs. In one embodiment, combinatorial logic block 100 is constructed from logic gate elements so that its outputs follow its inputs as described by the equations shown in FIGS. 4a and 4b. In the figures, the 8 binary bits that are input to encoder 13 are represented by the symbols B7-B0 with B7 being the most significant bit, and the 12 BCT bits that are output by block 100 are represented by the symbols T11-T0, with T11 being the most significant bit. The symbols m1-7, p1-3, s1-10, t1-3, u1-2, v1-2, and "special" in FIGS. 4a–b, all represent intermediate logic values that are used to generate T11-T0.

Figure 5:
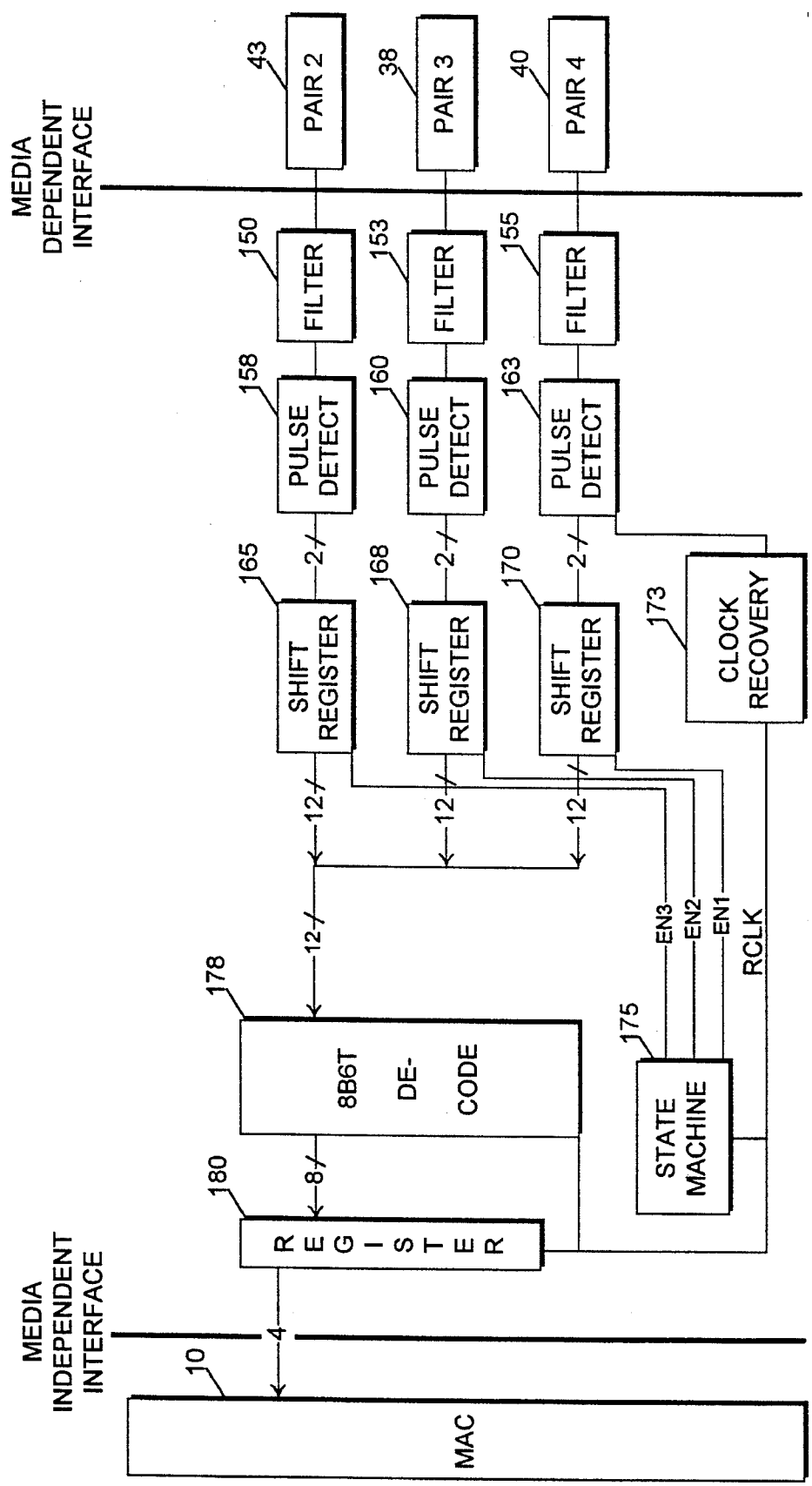
FIG. 5 is a block diagram of a data decoding and receiving system that could effectively employ a 8B6T decoder according to an embodiment of the invention.

FIG. 5 shows one type data receiver system in which the decoder of the present invention may be effectively employed. This receiver system was also discussed in the Fast Ethernet Alliance's 4T+ Media Specification proposal discussed above. The receiver receives serial ternary encoded data over a total of three twisted-pair transmission lines. Serial, DC balanced ternary data is received over the three twisted pair lines 43, 38, and 40. The signals are filtered by filters 150, 153, and 155 and are then input into pulse detectors 158, 160, 163. The pulse detectors detect whether there is a positive pulse, a negative pulse, or no pulse on their connected data transmission channel during a clock cycle and output a 2-bit binary code word for each of these pulses as shown in Table 1.

The 2-bit output from the pulse detectors is collected by serial-in/parallel-out shift registers 165, 168, and 170. The shift registers reconstruct the 12-bit transmitted BCT codewords. A signal from one of the pulse detectors, 163, is provided to clock recovery circuit 173, which generates a 25 Mhz clock synchronized to the clock cycle of the recovered data.

State machine 175 generates three sequential enable signals EN1, EN2, and EN3, based on the recovered clock which during each clock cycle enables just one of the three shift registers 165, 168, and 170 to output its data to 8B6T decoder 178. Once the 12-bit data has been decoded, it is placed in register 180 and is available for transmission to MAC 10.

Figure 6:
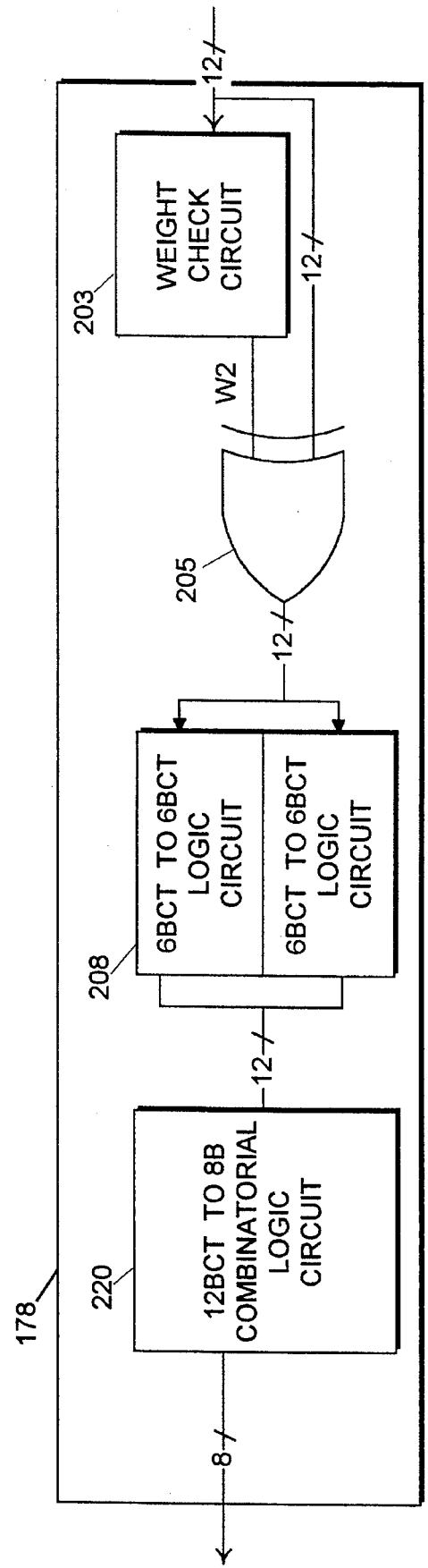
FIG. 6 is a block diagram of a 8B6T decoder according to an embodiment of the invention.

FIG. 6 is a block diagram of 8B6T decoder 178. The 12 BCT code words are first received by weight-check circuit 203 that determines the ternary algebraic weight of the BCT code word and for each code word with a weight of −1, circuit 203 asserts a signal W2 to XOR gate 205. When W2 is high, the 12-bit BCT output of XOR gate 205 is the bit-by-bit inverse of its 12-bit BCT input. The output of XOR gate 205 is then presented to logic block 208 which makes a determination as to which of the two possible 2-bit codes to use for trits that have a zero value. As can be seen from Table 1, when translating from 12BCT to 6T, both the 2-bit doublets 01 and 10 translate to a 0 trit. When the reverse translation is made, a determination must be made as to how 0 trit digits will be translated to a 2-bit binary doublet. According to the invention, this determination is made by examining each 6-bit half of the 12 BCT code word and determining what is the ternary algebraic weight of that half. Logic block 208 then converts the zero code doublets in the 6-bit half according to the assignment shown in Table 2.

TABLE 2

| Ternary | Binary | |
|---|---|---|
| − | 00 | |
| 0 | 01 | If the half has negative algebraic weight |
| 0 | 10 | If the half has positive algebraic weight |
| + | 11 | |

Logic block 208 contains two identical logic circuits that have as their input one half of the 12-bit BCT code word.

Each half of block 208 examines its input to determine if the combined algebraic weight of the three ternary digits represented by that code word is positive, negative, or zero. If the algebraic weight is positive, block 208 assigns the code "01" for any 0 trits on its input. If the algebraic weight is negative, block 208 assigns the code "10" for any 0 trits on its input. For the purposes of making this assignment, block 208 treats the zero algebraic weight halves −1 1 0, 0 −1 1, and 1 0 −1 as having negative algebraic weight and treats the halves 1 −1 0, 0 1 −1, −1 0 1, and 0 0 0 as having positive algebraic weight. While in this specific embodiment the decode functions of logic blocks 208 and 220 are shown as being carried out by two distinct circuit elements, it would be obvious to one of ordinary skill in the art that these logic blocks could be combined into a single logic circuit.

The 12-bit BCT code word is then output by circuit 208 to 12BCT to 8B combinatorial logic block 220. Block 220 converts each 12-bit input to an 8-bit output in accordance with the table shown in FIGS. 3a–c and the 8-bit data words are output to register 180 where it is available to MAC 10.

FIG. 7 shows a symbolic representation of the logic relationships that determine the outputs of combinatorial logic block 220 based on the inputs. In one embodiment, combinatorial logic block 220 is constructed from logic gate elements so that its outputs follow its inputs as described by the equations shown in FIG. 7. In FIG. 7, the 12 BCT bits that are input to block 220 are represented by the symbols T11-T0 with T11 being the most significant bit, and the 8 binary bits that are output by circuit 220 are represented by the symbols B7-B0 with B7 being the most significant bit. The symbols al, ar, bl, br, cl, cr, dl, dr, el, er, fl, fr, lp0, rp0, ln0, rn0, lp1, ln1, lp2, rp2, ln2, rn2, 10hat, x10, x8, x4, x2, and "special" all represent intermediate logic values that are used in the equations to generate B7-B0.

While the above is a complete description of specific embodiments of the invention, various modifications, alternative constructions, and equivalents may be used. The code assignments shown in FIGS. 3a–c could be modified, for example, without changing the essential nature of the invention, or the logical relationships shown in FIGS. 4a–b and FIG. 7 could be written in slightly different form but with equivalent results. Signals that are active low could be substituted for signals that are active high. Processing functions of particular circuit elements could be divided out into separate elements or circuit elements shown in specific embodiments as individual functional blocks could be combined. The specific method for assigning 2-bit codes as shown in Table 1 could be modified without changing the essential nature of the invention by, for example, using a 3-bit binary nibble to represent each trit in the ternary code word. Therefore, the above description should not be taken as limiting the scope of the invention as defined by the claims.

What is claimed is:

1. An encoder/transmitter for 8B-6T code conversion, comprising:
   means for receiving an 8-bit binary data word;
   combinatorial logic means capable of converting each possible 8-bit binary data word to an unique 12-bit binary-coded-ternary (BCT) code word, operatively connected to;
   a circuit for selecting an inverted code word for every other code word that has an algebraic weight of +1 in a series of code words, operatively connected to;
   means for separating said 12-bit code word into subparts operatively connected to;
   a signal generator for producing a serial ternary data stream in response to said subparts.

2. The encoder according to claim 1, wherein said unique 12-bit binary-coded-ternary (BCT) code word is representative of a 6-trit ternary code word and wherein each 6-trit ternary code word has an algebraic weight of either 0 or +1 and has no more than three leading or trailing zeros.

3. The encoder according to claim 1, wherein said combinatorial logic means is additionally capable of detecting when the algebraic weight of a 12-bit BCT code word is +1 and generating a signal when the algebraic weight of a 12-bit BCT code word is +1.

4. A decoder/receiver for 6T-8B code conversion, comprising:
   a ternary detector which produces a 2-bit binary signal in response to each digit in a serial ternary pulse data stream received on a channel operatively connected to;
   means for assembling a 12-bit binary-coded-ternary (BCT) code word for each six ternary trits received operatively connected to;
   an algebraic weight detecting circuit for detecting when the algebraic weight of a 12-bit BCT code word is −1 operatively connected to;
   a circuit for selecting an inverted code word for every code word that has an algebraic weight of −1, operatively connected to;
   a combinatorial logic means for converting each 12-bit binary-coded-ternary (BCT) code word to an 8-bit binary data word.

5. Apparatus for encoding eight bit binary data words into six trit ternary code words comprising:
   receiver means for receiving the binary data word;
   combinatorial logic encoder means coupled to the receiver means, for producing encoded data capable of being converted into ternary code words;
   said ternary code words having no more than a first preselected number of leading or trailing zeros;
   said ternary code words having an algebraic weight of zero or plus one.

6. Apparatus for decoding six trit ternary code words into eight bit binary data comprising:
   receiver means for receiving the 6 trit code words;
   ternary to binary conversion circuit for converting each trit of said 6 trit code words into a binary representation for assembling into a binary coded ternary word;
   said ternary code words having no more than a first preselected number of leading or trailing zeros;
   said ternary code words having an algebraic weight of zero or plus one; and
   combinatorial logic decoder means for converting the ternary code words into binary data words.

7. The apparatus according to claim 6 wherein said representation is two binary bits and wherein said binary coded ternary word is a 12-bit word.

8. A method for encoding an eight bit binary data word into a six trit ternary code word, said method comprising the steps of:
   receiving the binary data word; and
   converting said binary data word to a binary coded ternary code word data word using combinatorial logic;
   said binary coded ternary code word being capable of being converted into ternary code words;
   said ternary code words having no more than a first preselected number of leading or trailing zeros;

said ternary code words having an algebraic weight of zero or plus one.

9. A method for decoding a six trit ternary code word into an eight bit binary data word, said method comprising the steps of:

receiving the ternary code word;

producing a binary coded ternary code word capable of being converted into a binary data word;

said binary coded ternary code word representing a ternary code word having no more than a first preselected number of leading or trailing zeros;

said binary coded ternary code word representing a ternary code word having an algebraic weight factor of zero or plus one; and converting said binary coded ternary code word to a binary data word using combinatorial logic.

10. The method according to claims 8 or 9 wherein converting between 8 bit binary data words and 6-trit ternary code words produces results in accordance with the following table:

| Binary | Ternary | | | | | |
|---|---|---|---|---|---|---|
| 00000000 | − | + | 0 | 0 | − | + |
| 00000001 | 0 | − | + | − | + | 0 |
| 00000010 | 0 | − | + | 0 | − | + |
| 00000011 | 0 | − | + | + | 0 | − |
| 00000100 | − | + | 0 | + | 0 | − |
| 00000101 | + | 0 | − | − | + | 0 |
| 00000110 | + | 0 | − | 0 | − | + |
| 00000111 | + | 0 | − | + | 0 | − |
| 00001000 | − | + | 0 | 0 | + | − |
| 00001001 | 0 | − | + | + | − | 0 |
| 00001010 | 0 | − | + | 0 | + | − |
| 00001011 | 0 | − | + | − | 0 | + |
| 00001100 | − | + | 0 | − | 0 | + |
| 00001101 | + | 0 | − | + | − | 0 |
| 00001110 | + | 0 | − | 0 | + | − |
| 00001111 | + | 0 | − | − | 0 | + |
| 00010000 | 0 | − | − | + | 0 | + |
| 00010001 | − | 0 | − | 0 | + | + |
| 00010010 | − | 0 | − | + | 0 | + |
| 00010011 | − | 0 | − | + | + | 0 |
| 00010100 | 0 | − | − | + | + | 0 |
| 00010101 | − | − | 0 | 0 | + | + |
| 00010110 | − | − | 0 | + | 0 | + |
| 00010111 | − | − | 0 | + | + | 0 |
| 00011000 | − | + | 0 | − | + | 0 |
| 00011001 | + | − | 0 | − | + | 0 |
| 00011010 | − | + | + | − | + | 0 |
| 00011011 | + | 0 | 0 | − | + | 0 |
| 00011100 | + | 0 | 0 | + | − | 0 |
| 00011101 | − | + | + | + | − | 0 |
| 00011110 | + | − | 0 | + | − | 0 |
| 00011111 | − | + | 0 | + | − | 0 |
| 00100000 | − | + | + | − | 0 | 0 |
| 00100001 | + | 0 | 0 | + | − | − |
| 00100010 | − | + | 0 | − | + | + |
| 00100011 | + | − | 0 | − | + | + |
| 00100100 | + | − | 0 | 0 | 0 | 0 |
| 00100101 | − | + | 0 | + | 0 | 0 |
| 00100110 | + | 0 | 0 | − | 0 | 0 |
| 00100111 | − | + | + | + | − | − |
| 00101000 | 0 | + | + | − | 0 | − |
| 00101001 | + | 0 | + | 0 | − | − |
| 00101010 | + | 0 | + | − | 0 | − |
| 00101011 | + | 0 | + | − | − | 0 |
| 00101100 | 0 | + | + | − | − | 0 |
| 00101101 | + | + | 0 | 0 | − | − |
| 00101110 | + | + | 0 | − | 0 | − |
| 00101111 | + | + | 0 | − | − | 0 |
| 00110000 | + | − | 0 | 0 | − | + |
| 00110001 | 0 | + | − | − | + | 0 |
| 00110010 | 0 | + | − | 0 | − | + |
| 00110011 | 0 | + | − | + | 0 | − |
| 00110100 | + | − | 0 | + | 0 | − |
| 00110101 | − | 0 | + | − | + | 0 |
| 00110110 | − | 0 | + | 0 | − | + |
| 00110111 | − | 0 | + | + | 0 | − |
| 00111000 | + | − | 0 | 0 | + | − |
| 00111001 | 0 | + | − | + | − | 0 |
| 00111010 | 0 | + | − | 0 | + | − |
| 00111011 | 0 | + | − | − | 0 | + |
| 00111100 | + | − | 0 | − | 0 | + |
| 00111101 | − | 0 | + | + | − | 0 |
| 00111110 | − | 0 | + | 0 | + | − |
| 00111111 | − | 0 | + | − | 0 | + |
| 01000000 | − | 0 | 0 | + | 0 | + |
| 01000001 | 0 | − | 0 | 0 | + | + |
| 01000010 | 0 | − | 0 | + | 0 | + |
| 01000011 | 0 | − | 0 | + | + | 0 |
| 01000100 | − | 0 | 0 | + | + | 0 |
| 01000101 | 0 | 0 | − | 0 | + | + |
| 01000110 | 0 | 0 | − | + | 0 | + |
| 01000111 | 0 | 0 | − | + | + | 0 |
| 01001000 | 0 | 0 | + | 0 | 0 | 0 |
| 01001001 | + | + | − | 0 | 0 | 0 |
| 01001010 | + | − | + | 0 | 0 | 0 |
| 01001011 | − | + | + | 0 | 0 | 0 |
| 01001100 | 0 | + | − | 0 | 0 | 0 |
| 01001101 | + | 0 | − | 0 | 0 | 0 |
| 01001110 | 0 | − | + | 0 | 0 | 0 |
| 01001111 | − | 0 | + | 0 | 0 | 0 |
| 01010000 | + | − | − | + | 0 | + |
| 01010001 | − | + | − | 0 | + | + |
| 01010010 | − | + | − | + | 0 | + |
| 01010011 | − | + | − | + | + | 0 |
| 01010100 | + | − | − | + | + | 0 |
| 01010101 | − | − | + | 0 | + | + |
| 01010110 | − | − | + | + | 0 | + |
| 01010111 | − | − | + | + | + | 0 |
| 01011000 | − | − | 0 | + | + | + |
| 01011001 | − | 0 | − | + | + | + |
| 01011010 | 0 | − | − | + | + | + |
| 01011011 | 0 | − | − | 0 | + | + |
| 01011100 | + | − | − | 0 | + | + |
| 01011101 | − | 0 | 0 | 0 | + | + |
| 01011110 | 0 | + | + | + | − | − |
| 01011111 | 0 | + | + | − | 0 | 0 |
| 01100000 | 0 | + | + | 0 | − | 0 |
| 01100001 | + | 0 | + | − | 0 | 0 |
| 01100010 | + | 0 | + | 0 | − | 0 |
| 01100011 | + | 0 | + | 0 | 0 | − |
| 01100100 | 0 | + | + | 0 | 0 | − |
| 01100101 | + | + | 0 | − | 0 | 0 |
| 01100110 | + | + | 0 | 0 | − | 0 |
| 01100111 | + | + | 0 | 0 | 0 | − |
| 01101000 | 0 | + | + | − | + | − |
| 01101001 | + | 0 | + | + | − | − |
| 01101010 | + | 0 | + | − | + | − |
| 01101011 | + | 0 | + | − | − | + |
| 01101100 | 0 | + | + | − | − | + |
| 01101101 | + | + | 0 | + | − | − |
| 01101110 | + | + | 0 | − | + | − |
| 01101111 | + | + | 0 | − | − | + |
| 01110000 | 0 | 0 | 0 | + | + | − |
| 01110001 | 0 | 0 | 0 | + | − | + |
| 01110010 | 0 | 0 | 0 | − | + | + |
| 01110011 | 0 | 0 | 0 | + | 0 | 0 |
| 01110100 | 0 | 0 | 0 | + | 0 | − |
| 01110101 | 0 | 0 | 0 | + | − | 0 |
| 01110110 | 0 | 0 | 0 | − | 0 | + |
| 01110111 | 0 | 0 | 0 | − | + | 0 |
| 01111000 | + | + | + | − | − | 0 |
| 01111001 | + | + | + | − | 0 | − |
| 01111010 | + | + | + | 0 | − | − |
| 01111011 | 0 | + | + | 0 | − | − |
| 01111100 | − | 0 | 0 | − | + | + |
| 01111101 | − | 0 | 0 | + | 0 | 0 |
| 01111110 | + | − | − | − | + | + |
| 01111111 | + | − | − | + | 0 | 0 |
| 10000000 | − | 0 | 0 | + | − | + |
| 10000001 | 0 | − | 0 | − | + | + |

-continued

| Binary | Ternary | | | | |
|---|---|---|---|---|---|
| 10000010 | 0 | − | 0 | + | − | + |
| 10000011 | 0 | − | 0 | + | + | − |
| 10000100 | − | 0 | 0 | + | + | − |
| 10000101 | 0 | 0 | − | − | + | + |
| 10000110 | 0 | 0 | − | + | − | + |
| 10000111 | 0 | 0 | − | + | + | − |
| 10001000 | − | 0 | 0 | 0 | + | 0 |
| 10001001 | 0 | − | 0 | + | 0 | 0 |
| 10001010 | 0 | − | 0 | 0 | + | 0 |
| 10001011 | 0 | − | 0 | 0 | 0 | + |
| 10001100 | − | 0 | 0 | 0 | 0 | + |
| 10001101 | 0 | 0 | − | + | 0 | 0 |
| 10001110 | 0 | 0 | − | 0 | + | 0 |
| 10001111 | 0 | 0 | − | 0 | 0 | + |
| 10010000 | + | − | − | + | − | + |
| 10010001 | − | + | − | − | + | + |
| 10010010 | − | + | − | + | − | + |
| 10010011 | − | + | − | + | + | − |
| 10010100 | + | − | − | + | + | − |
| 10010101 | − | − | + | − | + | + |
| 10010110 | − | − | + | + | − | + |
| 10010111 | − | − | + | + | + | − |
| 10011000 | + | − | − | 0 | + | 0 |
| 10011001 | − | + | − | + | 0 | 0 |
| 10011010 | − | + | − | 0 | + | 0 |
| 10011011 | − | + | − | 0 | 0 | + |
| 10011100 | + | − | − | 0 | 0 | + |
| 10011101 | − | − | + | + | 0 | 0 |
| 10011110 | − | − | + | 0 | + | 0 |
| 10011111 | − | − | + | 0 | 0 | + |
| 10100000 | − | + | + | 0 | − | 0 |
| 10100001 | + | − | + | − | 0 | 0 |
| 10100010 | + | − | + | 0 | − | 0 |
| 10100011 | + | − | + | 0 | 0 | − |
| 10100100 | − | + | + | 0 | 0 | − |
| 10100101 | + | + | − | − | 0 | 0 |
| 10100110 | + | + | − | 0 | − | 0 |
| 10100111 | + | + | − | 0 | 0 | − |
| 10101000 | − | + | + | − | + | − |
| 10101001 | + | − | + | + | − | − |
| 10101010 | + | − | + | − | + | − |
| 10101011 | + | − | + | − | − | + |
| 10101100 | − | + | + | − | − | + |
| 10101101 | + | + | − | + | − | − |
| 10101110 | + | + | − | − | + | − |
| 10101111 | + | + | − | − | − | + |
| 10110000 | + | 0 | 0 | 0 | − | 0 |
| 10110001 | 0 | + | 0 | − | 0 | 0 |
| 10110010 | 0 | + | 0 | 0 | − | 0 |
| 10110011 | 0 | + | 0 | 0 | 0 | − |
| 10110100 | + | 0 | 0 | 0 | 0 | − |
| 10110101 | 0 | 0 | + | − | 0 | 0 |
| 10110110 | 0 | 0 | + | 0 | − | 0 |
| 10110111 | 0 | 0 | + | 0 | 0 | − |
| 10111000 | + | 0 | 0 | − | + | − |
| 10111001 | 0 | + | 0 | + | − | − |
| 10111010 | 0 | + | 0 | − | + | − |
| 10111011 | 0 | + | 0 | − | − | + |
| 10111100 | + | 0 | 0 | − | − | + |
| 10111101 | 0 | 0 | + | + | − | − |
| 10111110 | 0 | 0 | + | − | + | − |
| 10111111 | 0 | 0 | + | − | − | + |
| 11000000 | − | + | 0 | + | − | + |
| 11000001 | 0 | − | + | − | + | + |
| 11000010 | 0 | − | + | + | − | + |
| 11000011 | 0 | − | + | + | + | − |
| 11000100 | − | + | 0 | + | + | − |
| 11000101 | + | 0 | − | − | + | + |
| 11000110 | + | 0 | − | + | − | + |
| 11000111 | + | 0 | − | + | + | − |
| 11001000 | − | + | 0 | 0 | + | 0 |
| 11001001 | 0 | − | + | + | 0 | 0 |
| 11001010 | 0 | − | + | 0 | + | 0 |
| 11001011 | 0 | − | + | 0 | 0 | + |
| 11001100 | − | + | 0 | 0 | 0 | + |
| 11001101 | + | 0 | − | + | 0 | 0 |
| 11001110 | + | 0 | − | 0 | + | 0 |
| 11001111 | + | 0 | − | 0 | 0 | + |
| 11010000 | + | − | 0 | + | − | + |
| 11010001 | 0 | + | − | − | + | + |
| 11010010 | 0 | + | − | + | − | + |
| 11010011 | 0 | + | − | + | + | − |
| 11010100 | + | − | 0 | + | + | − |
| 11010101 | − | 0 | + | − | + | + |
| 11010110 | − | 0 | + | + | − | + |
| 11010111 | − | 0 | + | + | + | − |
| 11011000 | + | − | 0 | 0 | + | 0 |
| 11011001 | 0 | + | − | + | 0 | 0 |
| 11011010 | 0 | + | − | 0 | + | 0 |
| 11011011 | 0 | + | − | 0 | 0 | + |
| 11011100 | + | − | 0 | 0 | 0 | + |
| 11011101 | − | 0 | + | + | 0 | 0 |
| 11011110 | − | 0 | + | 0 | + | 0 |
| 11011111 | − | 0 | + | 0 | 0 | + |
| 11100000 | − | + | + | 0 | − | + |
| 11100001 | + | − | + | − | + | 0 |
| 11100010 | + | − | + | 0 | − | + |
| 11100011 | + | − | + | + | 0 | − |
| 11100100 | − | + | + | + | 0 | − |
| 11100101 | + | + | − | − | + | 0 |
| 11100110 | + | + | − | 0 | − | + |
| 11100111 | + | + | − | + | 0 | − |
| 11101000 | − | + | + | 0 | + | − |
| 11101001 | + | − | + | + | − | 0 |
| 11101010 | + | − | + | 0 | + | − |
| 11101011 | + | − | + | − | 0 | + |
| 11101100 | − | + | + | − | 0 | + |
| 11101101 | + | + | − | + | − | 0 |
| 11101110 | + | + | − | 0 | + | − |
| 11101111 | + | + | − | − | 0 | + |
| 11110000 | + | 0 | 0 | 0 | − | + |
| 11110001 | 0 | + | 0 | − | + | 0 |
| 11110010 | 0 | + | 0 | 0 | − | + |
| 11110011 | 0 | + | 0 | + | 0 | − |
| 11110100 | + | 0 | 0 | + | 0 | − |
| 11110101 | 0 | 0 | + | − | + | 0 |
| 11110110 | 0 | 0 | + | 0 | − | + |
| 11110111 | 0 | 0 | + | + | 0 | − |
| 11111000 | + | 0 | 0 | 0 | + | − |
| 11111001 | 0 | + | 0 | + | − | 0 |
| 11111010 | 0 | + | 0 | 0 | + | − |
| 11111011 | 0 | + | 0 | − | 0 | + |
| 11111100 | + | 0 | 0 | − | 0 | + |
| 11111101 | 0 | 0 | + | + | − | 0 |
| 11111110 | 0 | 0 | + | 0 | + | − |
| 11111111 | 0 | 0 | + | − | 0 | + |

11. A system for transmitting binary data between a transmitter and a receiver comprising:

means for receiving a sequence of 8-bit binary data words from a transmitter;

combinatorial logic means for converting said 8-bit data words into binary coded ternary code words with an algebraic weight of 0 or 1;

means for DC balancing a sequence of said code words by inverting every second code word that has an algebraic weight of 1 thereby producing an inverted code word with an algebraic weight of −1;

means for converting subparts of said code word into a ternary pulse;

a medium for transmitting said ternary pulses to said receiver;

means at said receiver for detecting said ternary pulses and generating a binary representation for each detected pulse;

means for assembling said binary representation codes into a received binary coded ternary code word;

means for inverting each said received code word that has an algebraic weight of −1; and combinatorial logic means for converting each said received code word to a received 8-bit binary data word and making said received data word available to said receiver.

12. The system according to claim 9 wherein said subparts are two binary bits and wherein said ternary code word is a 12-bit word.

13. The encoder according to claims 1, 2, or 3, the decoder according to claim 4, the apparatus according to claims 5 or 6, and the system according to claim 11, wherein said combinatorial logic is operative to convert between 8-bit binary data words and 6-trit ternary code words according to the following table:

| Binary | Ternary | | | | | |
|---|---|---|---|---|---|---|
| 00000000 | − | + | 0 | 0 | − | + |
| 00000001 | 0 | − | + | − | + | 0 |
| 00000010 | 0 | − | + | 0 | − | + |
| 00000011 | 0 | − | 0 | + | + | 0 |
| 00000100 | − | + | 0 | + | 0 | − |
| 00000101 | + | 0 | − | − | + | 0 |
| 00000110 | + | 0 | − | 0 | − | + |
| 00000111 | + | 0 | − | + | 0 | − |
| 00001000 | − | + | 0 | 0 | + | − |
| 00001001 | 0 | − | + | + | − | 0 |
| 00001010 | 0 | − | + | 0 | + | − |
| 00001011 | 0 | − | + | − | 0 | + |
| 00001100 | − | + | 0 | − | 0 | + |
| 00001101 | + | 0 | − | + | − | 0 |
| 00001110 | + | 0 | − | 0 | + | − |
| 00001111 | + | 0 | − | − | 0 | + |
| 00010000 | 0 | − | − | + | 0 | + |
| 00010001 | − | 0 | − | 0 | + | + |
| 00010010 | − | 0 | − | + | 0 | + |
| 00010011 | − | 0 | − | + | + | 0 |
| 00010100 | 0 | − | − | + | + | 0 |
| 00010101 | − | − | 0 | 0 | + | + |
| 00010110 | − | − | 0 | + | 0 | + |
| 00010111 | − | − | 0 | + | + | 0 |
| 00011000 | − | + | 0 | − | + | 0 |
| 00011001 | + | − | 0 | − | + | 0 |
| 00011010 | − | + | + | − | + | 0 |
| 00011011 | + | 0 | 0 | − | + | 0 |
| 00011100 | + | 0 | 0 | + | − | 0 |
| 00011101 | − | + | + | + | − | 0 |
| 00011110 | + | − | 0 | + | − | 0 |
| 00011111 | − | + | 0 | + | − | 0 |
| 00100000 | − | + | + | − | 0 | 0 |
| 00100001 | + | 0 | 0 | + | − | − |
| 00100010 | − | + | 0 | − | + | + |
| 00100011 | + | − | 0 | − | + | + |
| 00100100 | + | − | 0 | + | 0 | 0 |
| 00100101 | − | + | 0 | + | 0 | 0 |
| 00100110 | + | 0 | 0 | − | 0 | 0 |
| 00100111 | − | + | + | + | − | − |
| 00101000 | 0 | + | + | − | 0 | − |
| 00101001 | + | 0 | + | 0 | − | − |
| 00101010 | + | 0 | + | − | 0 | − |
| 00101011 | + | 0 | + | − | − | 0 |
| 00101100 | 0 | + | + | − | − | 0 |
| 00101101 | + | + | 0 | 0 | − | − |
| 00101110 | + | + | 0 | − | 0 | − |
| 00101111 | + | + | 0 | − | − | 0 |
| 00110000 | + | − | 0 | 0 | − | + |
| 00110001 | 0 | + | − | − | + | 0 |
| 00110010 | 0 | + | − | 0 | − | + |
| 00110011 | 0 | + | − | + | 0 | − |
| 00110100 | + | − | 0 | + | 0 | − |
| 00110101 | − | 0 | + | − | + | 0 |
| 00110110 | − | 0 | + | 0 | − | + |
| 00110111 | − | 0 | + | + | 0 | − |
| 00111000 | + | − | 0 | 0 | + | − |
| 00111001 | 0 | + | − | + | − | 0 |
| 00111010 | 0 | + | − | 0 | + | − |
| 00111011 | 0 | + | − | − | 0 | + |
| 00111100 | + | − | 0 | − | 0 | + |
| 00111101 | − | 0 | + | + | − | 0 |
| 00111110 | − | 0 | + | 0 | + | − |
| 00111111 | − | 0 | + | − | 0 | + |
| 01000000 | − | 0 | 0 | + | 0 | + |
| 01000001 | 0 | − | 0 | 0 | + | + |
| 01000010 | 0 | − | 0 | + | 0 | + |
| 01000011 | 0 | − | 0 | + | + | 0 |
| 01000100 | − | 0 | 0 | + | + | 0 |
| 01000101 | 0 | 0 | − | 0 | + | + |
| 01000110 | 0 | 0 | − | + | 0 | + |
| 01000111 | 0 | 0 | − | + | + | 0 |
| 01001000 | 0 | 0 | + | 0 | 0 | 0 |
| 01001001 | + | + | − | 0 | 0 | 0 |
| 01001010 | + | − | + | 0 | 0 | 0 |
| 01001011 | − | + | + | 0 | 0 | 0 |
| 01001100 | 0 | + | − | 0 | 0 | 0 |
| 01001101 | + | 0 | − | 0 | 0 | 0 |
| 01001110 | 0 | − | + | 0 | 0 | 0 |
| 01001111 | − | 0 | + | 0 | 0 | 0 |
| 01010000 | + | − | − | + | 0 | + |
| 01010001 | − | + | − | 0 | + | + |
| 01010010 | − | + | − | + | 0 | + |
| 01010011 | − | + | − | + | + | 0 |
| 01010100 | + | − | − | + | + | 0 |
| 01010101 | − | − | + | 0 | + | + |
| 01010110 | − | − | + | + | 0 | + |
| 01010111 | − | − | + | + | + | 0 |
| 01011000 | − | − | 0 | + | + | + |
| 01011001 | − | 0 | − | + | + | + |
| 01011010 | 0 | − | − | 0 | + | + |
| 01011011 | 0 | − | − | 0 | + | + |
| 01011100 | + | − | − | 0 | + | + |
| 01011101 | − | 0 | 0 | 0 | + | + |
| 01011110 | 0 | + | + | + | − | − |
| 01011111 | 0 | + | + | − | 0 | 0 |
| 01100000 | 0 | + | + | 0 | − | 0 |
| 01100001 | + | 0 | + | − | 0 | 0 |
| 01100010 | + | 0 | + | 0 | − | 0 |
| 01100011 | + | 0 | + | 0 | 0 | − |
| 01100100 | 0 | + | + | 0 | 0 | − |
| 01100101 | + | + | 0 | − | 0 | 0 |
| 01100110 | + | + | 0 | 0 | − | 0 |
| 01100111 | + | + | 0 | 0 | 0 | − |
| 01101000 | 0 | + | + | − | + | − |
| 01101001 | + | 0 | + | + | − | − |
| 01101010 | + | 0 | + | − | + | − |
| 01101011 | + | 0 | + | − | − | + |
| 01101100 | 0 | + | + | − | − | + |
| 01101101 | + | + | 0 | + | − | − |
| 01101110 | + | + | 0 | − | + | − |
| 01101111 | + | + | 0 | − | − | + |
| 01110000 | 0 | 0 | 0 | + | + | − |
| 01110001 | 0 | 0 | 0 | + | − | + |
| 01110010 | 0 | 0 | 0 | − | + | + |
| 01110011 | 0 | 0 | 0 | + | 0 | 0 |
| 01110100 | 0 | 0 | 0 | 0 | + | 0 |
| 01110101 | 0 | 0 | 0 | + | − | 0 |
| 01110110 | 0 | 0 | 0 | − | 0 | + |
| 01110111 | 0 | 0 | 0 | − | + | 0 |
| 01111000 | + | + | + | − | − | 0 |
| 01111001 | + | + | + | − | 0 | − |
| 01111010 | + | + | + | 0 | − | − |
| 01111011 | 0 | + | + | 0 | − | − |
| 01111100 | − | 0 | 0 | − | + | + |
| 01111101 | − | 0 | 0 | + | 0 | 0 |
| 01111110 | + | − | − | − | + | + |
| 01111111 | + | − | − | + | 0 | 0 |
| 10000000 | − | 0 | 0 | + | − | + |
| 10000001 | 0 | − | 0 | − | + | + |
| 10000010 | 0 | − | 0 | + | − | + |
| 10000011 | 0 | − | 0 | + | + | − |
| 10000100 | − | 0 | 0 | + | + | − |
| 10000101 | 0 | 0 | − | − | + | + |
| 10000110 | 0 | 0 | − | + | − | + |
| 10000111 | 0 | 0 | − | + | + | − |
| 10001000 | − | 0 | 0 | 0 | + | 0 |
| 10001001 | 0 | − | 0 | + | 0 | 0 |
| 10001010 | 0 | − | 0 | 0 | + | 0 |
| 10001011 | 0 | − | 0 | 0 | 0 | + |

| Binary | Ternary |
|---|---|
| 10001100 | − 0 0 0 0 + |
| 10001101 | 0 0 − + 0 0 |
| 10001110 | 0 0 − 0 + 0 |
| 10001111 | 0 0 − 0 0 + |
| 10010000 | + − − + − + |
| 10010001 | − + − − + + |
| 10010010 | − + − + − + |
| 10010011 | − + − + + − |
| 10010100 | + − − + + − |
| 10010101 | − − + − + + |
| 10010110 | − − + + − + |
| 10010111 | − − + + + − |
| 10011000 | + − − 0 + 0 |
| 10011001 | − + − + 0 0 |
| 10011010 | − + − 0 + 0 |
| 10011011 | − + − 0 0 + |
| 10011100 | + − − 0 0 + |
| 10011101 | − − + + 0 0 |
| 10011110 | − − + 0 + 0 |
| 10011111 | − − + 0 0 + |
| 10100000 | − + + 0 − 0 |
| 10100001 | + − + − 0 0 |
| 10100010 | + − + 0 − 0 |
| 10100011 | + − + 0 0 − |
| 10100100 | − + + 0 0 − |
| 10100101 | + + − − 0 0 |
| 10100110 | + + − 0 − 0 |
| 10100111 | + + − 0 0 − |
| 10101000 | − + + − + − |
| 10101001 | + − + + − − |
| 10101010 | + − + − + − |
| 10101011 | + − + − − + |
| 10101100 | − + + − − + |
| 10101101 | + + − + − − |
| 10101110 | + + − − + − |
| 10101111 | + + − − − + |
| 10110000 | + 0 0 0 − 0 |
| 10110001 | 0 + 0 − 0 0 |
| 10110010 | 0 + 0 0 − 0 |
| 10110011 | 0 + 0 0 0 − |
| 10110100 | + 0 0 0 0 − |
| 10110101 | 0 0 + − 0 0 |
| 10110110 | 0 0 + 0 − 0 |
| 10110111 | 0 0 + 0 0 − |
| 10111000 | + 0 0 − + − |
| 10111001 | 0 + 0 + − − |
| 10111010 | 0 + 0 − + − |
| 10111011 | 0 + 0 − − + |
| 10111100 | + 0 0 − − + |
| 10111101 | 0 0 + + − − |
| 10111110 | 0 0 + − + − |
| 10111111 | 0 0 + − − + |
| 11000000 | − + 0 + − + |
| 11000001 | 0 − + − + + |
| 11000010 | 0 − + + − + |
| 11000011 | 0 − + + + − |
| 11000100 | − + 0 + + − |
| 11000101 | + 0 − − + + |
| 11000110 | + 0 − + − + |
| 11000111 | + 0 − + + − |
| 11001000 | − + 0 0 + 0 |
| 11001001 | 0 − + + 0 0 |
| 11001010 | 0 − + 0 + 0 |
| 11001011 | 0 − + 0 0 + |
| 11001100 | − + 0 0 0 + |
| 11001101 | + 0 − + 0 0 |
| 11001110 | + 0 − 0 + 0 |
| 11001111 | + 0 − 0 0 + |
| 11010000 | + − 0 + − + |
| 11010001 | 0 + − − + + |
| 11010010 | 0 + − + − + |
| 11010011 | 0 + − + + − |
| 11010100 | + − 0 + + − |
| 11010101 | − 0 + − + + |
| 11010110 | − 0 + + − + |
| 11010111 | − 0 + + + − |
| 11011000 | + − 0 0 + 0 |
| 11011001 | 0 + − + 0 0 |
| 11011010 | 0 + − 0 + 0 |
| 11011011 | 0 + − 0 0 + |
| 11011100 | + − 0 0 0 + |
| 11011101 | − 0 + + 0 0 |
| 11011110 | − 0 + 0 + 0 |
| 11011111 | − 0 + 0 0 + |
| 11100000 | − + + 0 − + |
| 11100001 | + − + − + 0 |
| 11100010 | + − + 0 − + |
| 11100011 | + − + + 0 − |
| 11100100 | − + + + 0 − |
| 11100101 | + + − − + 0 |
| 11100110 | + + − 0 − + |
| 11100111 | + + − + 0 − |
| 11101000 | − + + 0 + − |
| 11101001 | + − + + − 0 |
| 11101010 | + − + 0 + − |
| 11101011 | + − + + − 0 |
| 11101100 | − + + − 0 + |
| 11101101 | + + − + − 0 |
| 11101110 | + + − 0 + − |
| 11101111 | + + − − 0 + |
| 11110000 | + 0 0 0 − + |
| 11110001 | 0 + 0 − + 0 |
| 11110010 | 0 + 0 0 − + |
| 11110011 | 0 + 0 + 0 − |
| 11110100 | + 0 0 + 0 − |
| 11110101 | 0 0 + − + 0 |
| 11110110 | 0 0 + 0 − + |
| 11110111 | 0 0 + + 0 − |
| 11111000 | + 0 0 0 + − |
| 11111001 | 0 + 0 + − 0 |
| 11111010 | 0 + 0 0 + − |
| 11111011 | 0 + 0 − 0 + |
| 11111100 | + 0 0 − 0 + |
| 11111101 | 0 0 + + − 0 |
| 11111110 | 0 0 + 0 + − |
| 11111111 | 0 0 + − 0 + |

14. The encoder according to claims 1, 2, or 3, the decoder according to claim 4, the apparatus according to claims 5 or 6, or the system according to claim 11, wherein translation between each ternary trit and its binary representation is according to the following table:

| Binary | Ternary |
|---|---|
| 00 | − |
| 01 | 0 |
| 10 | 0 |
| 11 | + |

15. The encoder according to claims 1, 2, or 3, the apparatus according to claims 5, or the system according to claim 11, wherein said combinatorial logic for converting each possible 8-bit binary data word having binary digits B7-B0 to a unique 12-bit binary-coded-ternary (BCT) code word having binary digits T11-T0 is constructed such that its 12 bit output is a function of its 8 bit input according to the following logical relationships:

m1 = B7 * B5 * !B4;
m2 = !B7 * !B6 * B5 * B4;
m3 = !B7 * !B6 * !B5 * !B4;
m4 = !B7 * B6 * !B5 * B4 * !B3;
m5 = B7 * !B6 * !B5 * B4;
m6 = B7 * B6 * !B5 * !B4;
m7 = B7 * B6 * !B5 *B4;
p1 = B2 * (B1 + B0);
p2 = !B2 * (B1 + B0);
p3 = !B1 * !B0;
s1 = !B7 * !B6 * !B5 * !B4 * !B3;

```
s2 = !B7 * !B6 * !B5 * !B4 * B3;
s3 = B7 * !B6 * !B5 * !B3;
s4 = !B7 * B6 * !B5 * !B3;
s5 = !B7 * !B6 * B5 * B4 * !B3;
s6 = !B7 * !B6 *B5 * B4 * B3;
s7 = !B7 * B6 * B5 * !B4 * B3;
s8 = !B7 * !B6 * !B5 * B3;
s9 = B7 * B6 * B5 * !B3;
s10 = B7 * B6 * B5 * B3;
t1 = (B1 * B0) + (B2 * !B1 * !B0);
t2 = !B1 * B0;
t3 = (!B2 * !B1 * !B0) + (B1 * !B0);
u1 = B1 + B0;
u2 = B2 + (!B1 * !B0);
v1 = B1 + !B0;
v2 = B0 + (B2 * !B1);
special = (!B7 * !B6 * !B5 * B4 * B3) + (!B7 *
   !B6 * B5 * !B4 * !B3) + (!B7 * B6 * !B5 * B3) +
   (!B7 * B6 * B5 * B4);
T10 = (((u1 * !B4) + (!u1 * B4)) * !special) +
   (!B7 * !B6 * !B5 * B4 * B3 * ((!B2 * B0) + (B2
   * !B0))) + (!B7 * !B6 * B5 * !B4 * !B3 * ((!B2
   * B0) + (B2 * !B0))) + (!B7 * B6 * !B5 * !B4 *
   B3 * ((!B1 * B0) + (B1 * !B0))) + (!B7 * B6 *
   !B5 * B4 * B3 * ((!B2 * B1) + (B2 * !B1 *
   !B0))) + (!B7 * B6 * B5 * B4 * B3 * ((!B2 *
   !B1) + (B1 * !B0) + (B2 * B1)));
T8 = (((u2 * !B4) + (!u2 * B4)) * !special) + (!B7
   * !B6 * !B5 * B4 * B3 * ((!B2 * !B0) + (B2 *
   B0))) + (!B7 * !B6 * B5 * !B4 * !B3 * ((!B2 *
   !B0) + (B2 * B0))) + (!B7 * B6 * !B5 * !B4 * B3
   * ((!B2 * B0) + (B2 * !B1))) + (!B7 * B6 * !B5
   * B4 * B3 * ((!B1 * B0) + (B2 * B1))) + (!B7 *
   B6 * B5 * B4 * B3 * !(B2 * B1));
T6 = (((!B4 * (!B10 + !B8)) + (B4 * !B10 * !B8)) *
   !special) + (!B7 * !B6 * !B5 * B4 * B3 * ((!B2
   * !B0) + (B2 * B0))) + (!B7 * !B6 * B5 * !B4 *
   !B3 * ((!B2 * !B0) + (B2 * B0))) + (!B7 * B6 *
   !B5 * !B4 * B3 * (B1 + (!B2 * !B0))) + (!B7 *
   B6 * !B5 * B4 * B3 * ((B2 * B0) + (B2 * B1) +
   (!B2 * !B1 * !B0))) + (!B7 * B6 * B5 * B4 * B3
   * !(B2 * B1));
T4 = (((v1 * !B3) + (!v1 * B3)) * !special) +
   (!B7 * !B6 * !B5 * B4 * B3 * B2) + (!B7 * !B6
   * B5 * !B4 * !B3 * ((!B2 * !B1) + (B2 * B0) +
   (!B1 * B0))) + (!B7 * B6 * !B5 * B4 * B3 *
   ((!B2 * !B1) + (B1 * !B0))) + (!B7 * B6 * B5 *
   B4 * !B3 * (B1 + (!B2 * B0))) + (!B7 * B6 *
   B5 * B4 * B3 * ((B2 * B0) + (!B2 * B1)));
T2 = (((v2 * !B3) + (!v2 * B3)) * !special) +
   (!B7 * !B6 * !B5 * B4 * B3 * !B2) + (!B7 * !B6
   * B5 * !B4 * !B3 * !((B2 * !B1) + (B2 * B0) +
   (!B1 * B0))) + (!B7 * B6 * !B5 * B4 * B3 *
   !(B2 * B1 * !B0)) + (!B7 * B6 * B5 * B4 * !B3
   * ((!B2 * !B0) + (B2 * B1 * B0) + (!B1 *
   !B0))) + (!B7 * B6 * B5 * B4 * B3 * ((B2 *
   !B0) + (!B2 * !B1 * B0)))
T0 = ((((!B3 * (!B2 + !B4)) + (B3 * !B4 * !B2)) *
   !special) + (!B7 * !B6 * !B5 * B4 * B3 * !B2)
   + (!B7 * !B6 * B5 * !B4 * !B3 * !((B2 * !B1) +
   (B2 * B0) + (!B1 * B0))) + (!B7 * B6 * !B5 *
   B4 * B3 * !(B2 * B1 * !B0)) + (!B7 * B6 * B5 *
   B4 * !B3 * ((B2 * B1) + (!B2 * !B1 * B0) +
   (B1 * !B0))) + (!B7 * B6 * B5 * B4 * B3 * ((B2
   * !B0) + (!B1 * !B0)));
T11 = (B5 * !(m1 * p3) * !(m2 * p1) * !(!B7 * !B6
   * B5 * !B4 * !B3 * ((B2 * B0) + (!B2 * !B0)))
   * !(!B7 * B6 * B5 * B4 * B3 * (B2 * B1))) +
   (m3 * p1) + (m4 * p3) + (m5 * p3) + (m6 * p1)
   + (m7 * !p1) + (!B7 * !B6 * !B5 * B4 * B3 *
   ((!B2 * B0) + (B2 * !B0))) + (!B7 * !B6 * B5 *
   !B4 * B3 * ((!B1 * (!B2 * !B0))) + (!B7 * B6 *
   !B5 * B4 * B3 * ((B2 * B1) + (B2 * !B0)));
T9 = (B5 * !(m1 * p2) * !(m2 * p3) * !(!B7 * !B6
   * B5 * !B4 * !B3 * ((B2 * B1 * B0) + (B2 *
   !B1 *!B0))) * !(!B7 * B6 * B5 * B4 * B3 * B2))
   + (m3 * p3) + (m4 * p2) + (m5 * p2) + (m6 *
   p3) + (m7 * !p3) + (!B7 * !B6 * !B5 * B4 * B3
   * !((!B2 * !B1 * B0) + (B2 * B1 * !B0))) +
   (!B7 * !B6 * !B5 * !B4 * B3 * ((!B1 * !B0) +
   (B1 * B0) + (!B2 * B0))) + (!B7 * B6 * !B5 *
   B4 * B3 * B2 * B1);
T7 = (B5 * !(m1 * p1) * !(m2 * p2) * !(!B7 * !B6
   * B5 * !B4 * !B3 * ((!B2 * B1 * !B0) + (B2 *
   !B1 * B0))) * !(!B7 * B6 * B5 * B4 * B3 * B2))
   + (m3 * p2) + (m4 * p1) + (m5 * p1) + (m6 *
   p2) + (m7 * !p2) + (!B7 * !B6 * !B5 * B4 * B3
   * !((!B2 * !B1 * !B0)−↑§↑§G⊥ + (B2 * B1 * B0)))
   + (!B7 * B6 * !B5 * !B4 * B3 * (B1 + (!B2 *
   !B0))) + (!B7 * B6 * !B5 * B4 * B3 * B2 * B1);
T5 = (!B5 * !(s1 * !t1) * !(s2 * t1) * !(s3 * t2)
   * !(s4 * t2) * !(!B7 * !B6 * !B5 * B4 * B3
   * !B2) * !(!B7 * B6 * !B5 * B4 * B3 * B2 * B1
   * B0)) + (s5 * t1) + (s6 * !t1) + (s7 * t2) +
   (s8 * t2) + (s9 * t1) + (s10 * !t1) + (!B7 *
   !B6 * B5 * !B4 * !B3 * ((!B1 * B0) + (B2 * !B1)
   + (B2 * B0))) + (!B7 * B6 * B5 * B4 * !B3 *
   (!B1 + (!B2 * B0))) + (!B7 * B6 * B5 * B4 * B3
   * B2 * B0);
T3 = (!B5 * !(s1 * !t2) * !(s2 * t2) * !(s3 * t3)
   * !(s4 * t3) * !(!B7 * !B6 * !B5 * B4 * B3 *
   B2) * !(!B7 * B6 * !B5 * B4 * B3 * B2 * B1) )
   + (s5 * t2) + (s6 * !t2) + (s7 * t3) + (s8 *
   t3) + (s9 * t2) + (s10 * !t2) + (!B7 * !B6 *
   B5 * !B4 * !B3 * ((!B2 * B1) + (B2 * !B1))) +
   (!B7 * B6 * B5 * B4 * !B3 * (B1 + (!B2 * !B0)))
   + (!B7 * B6 * B5 * B4 * B3 * B2);
T1 = (!B5 * !(s1 * !t3) * !(s2 * t3) * !(s3 * t1)
   * !(s4 * t1) * !(!B7 * !B6 * !B5 * B4 * B3 *
   !B2) * !(!B7 * B6 * !B5 * B4 * B3 * B2 * B1))
   + (s5 * t3) + (s6 * !t3) + (s7 * t1) + (s8 *
   t1) + (s9 * t3) + (s10 * !t3) + (!B7 * !B6 *
   B5 * !B4 * !B3 * ((!B2 * B1) + (B2 * !B1))) +
   (!B7 * B6 * B5 * B4 * !B3 * ((!B1 * B0) + (B1
   * !B0) ‖ (!B2 * B1))) + (!B7 * B6 * B5 * B4 *
   B3 * B2).
```

16. The decoder according to claim 4, the apparatus according to claim 6, or the system according to claim 11, wherein said combinatorial logic circuit for converting each input 12-bit binary-coded-ternary data word having binary digits T11-T0 to an output 8-bit binary data word having binary digits B7-B0 is constructed such that its 8-bit output is a function of its 12-bit input according to the following logical relationships:

```
al = T11 * T9 * T7;
ar = T5 * T3 * T1;
bl = !T11 * !T9 * !T7;
br = !T5 * !T3 * !T1;
cl = (T10 * !T8 * !T6) + (!T10 * T8 * !T6) + (!T10
   * !T8 * T6);
cr = (T4 * !T2 * !T0) + (!T4 * T2 * !T0) + (!T4 *
   !T2 * T0);
dl = (!T10 * T8 * T6) + (T10 * !T8 * T6) + (T10 *
   T8 * !T6);
dr = (!T4 * T2 * T0) + (T4 * !T2 * T0) + (T4 * T2
   * !T0);
el = (!T11 * T9 * T8 * T7) + (T11 * !T9 * T7 * T6)
   + (T11 * T10 * T9 * !T7);
er = (!T5 * T3 * T2 * T1) + (T5 * !T3 * T1 * T0) +
   (T5 * T4 * T3 * !T1);
fl = (T11 * !T9 * !T8 * !T7) + (!T11 * T9 * !T7 *
   !T6) + (!T11 * !T10 * !T9 * !T7);
fr = ( T5 * !T3 * !T2 * !T1) + (!T5 * T3 * !T1 *
   !T0) + (!T5 * !T4 * !T3 * T1);
lp0 = (T11 * T10 * !T9 * !T8 * T7 * !T6) + (T11 *
   !T10 * T9 * T8 * !T7 * !T6) + (!T11 * !T10 * T9
   * !T8 * T7 * T6);
rp0 = (T5 * T4 * !T3 * !T2 * T1 * !T0) + (T5 * !T4
   * T3 * T2 * !T1 * !T0) + (!T5 * !T4 * T3 * !T2 *
   T1 * T0);
ln0 = (!T11 * !T10 * T9 * T8 * !T7 * T6) + (!T11 *
   T10 * !T9 * !T8 * T7 * T6) + (T11 * T10 * !T9 *
   T8 * !T7 * !T6);
rn0 = (!T5 * !T4 * T3 * T2 * !T1 * T0) + (!T5 * T4
   * !T3 * !T2 * T1 * T0) + (T5 * T4 * !T3 * !T2 *
```

```
        !T1 * !T0);
lp1 = (al * cl) + e1; rp1 = (ar * cr) + er;
ln1 = (bl * dl) + f1; rn1 = (br * dr) + fr;
lp2 = al * dl;
rp2 = ar * dr;
ln2 = bl * cl;
rn2 = br * cr;
lp3 = T10 * T8 * T6; rp3 = T4 * T2 * T0;
l0hat = !T10 * !T8 * !T6; r0hat = !T4 * !T2 * !T0;
x10 = (T10 * !cl) + (!T10 * cl)
x8 = (T8 * !cl) + (!T8 * cl);
x4 = (T4 * !cr) + (!T4 * cr);
x2 = (T2 * !cr) + (!T2 * cr);
special = (l0hat + r0hat + lp3 + rp3 + ( !T10 * T8
        * T6 * !T4 * T2 * T0) + (!T10 * T8 * T6 * T4 *
        !T2 * !T0) + (T10 * !T8 * !T6 * !T4 * T2 * T0)
        + ( T10 * !T8 * !T6 * T4 * !T2 * !T0));
B7 = ((lp1 + rp1) * !(l0hat + r0hat)) * !special;
B6 = (((lp0 + ln0 + l0hat) * rp1) + (ln1 * rp2) +
        (ln2 * rp3) + ((rp0 + rn0 + r0hat) * lp1) + (rn1
        * lp2) + (rn2 * lp3)) * !special + special *
        !(((rp0 + rn0) * !l0hat) + (lp1 * rn1) + ((ln0
        + lp0) * rp1));
B5 = ((lp0 * !rp1) + lp1 + lp2 + lp3) * special
        + special * (((T9 + T7) * rp1) + (lp1 * rn1) +
        l0hat + (lp2 * rn2) + (ln1 * !rp2) + lp3);
B4 = (cl * !special) + special * !( ((ln0 + lp0)
        * rp1) + (lp1 *rn1) + r0hat);
B3 = (cr * !special) + special * !( ((ln0 + lp0) *
        rp1) + (lp1 * rn1) + l0hat);
B2 = (((x10 * x8) + (!x10 * x2)) * !special) +
        special * (rp0 + (l0hat * rn0) + ((lp0 + ln0) *
        rp1 * T5) + (lp0 * r0hat) + (ln0 * r0hat) + (lp2
        !* !(!T5 * T4)) + (rp2 * !(!T11 * T10)) + (ln1 *
        rp1) + (lp1 * rn1 * ((T6 * T5) + (!T6 * !T5))));
B1 = (((x10 * x4) + (!x10 * !x4)) * !special) +
        special * ((lp1 * rn0) + (rp0 * !(T9 * T7)) + (rp1
        * ((!T6 * !T4) + (!T7 * !T6 * T5) + (!T11 * T9 *
        !T5))) + (rn1 * ((T6 * T5) + (!T6 * !T5) + (T11 *
        !T10))) + (r0hat * (T6 * !(T11 * T9)) + (ln2 *
        !T8 * !T6) + (rn2 * !T2 * !T0) + (l0hat * ((T3
        T1) + (!T5 * !T1))));
B0 = (((x10 * x2) + (!x10 * !x4)) * !special) +
        special * ((rn0 * T11 * !T5) + (rp0 * (!T11)) +
        (T5 * T4 * !T3 * !T2 * !T1 * !T0 * !(T11 *
        T10)) + (rp1 * ((!T0 * !T7) + (T7 * !T5 * !T9)))
        + (r0hat * ((T11 * T10 * T8) + (!T11 * !T10 *
        T7))) + (ln2 * (!T4 + T8)) + (rp2 * T6) + (lp2 *
        !T4) + (l0hat * (!T2 * T4)) + (rn2 * (T2 +
        !T10))).
```

* * * * *